(12) United States Patent
Zhang

(10) Patent No.: US 11,923,764 B1
(45) Date of Patent: Mar. 5, 2024

(54) ELECTROSTATIC DISCHARGE CIRCUIT FOR SWITCHING MODE POWER SUPPLY

(71) Applicant: TEXAS INSTRUMENTS INCORPORATED, Dallas, TX (US)

(72) Inventor: Liang Zhang, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/885,461

(22) Filed: Aug. 10, 2022

(51) Int. Cl.
  *H02M 1/32* (2007.01)
  *H01L 27/02* (2006.01)
  *H02M 1/00* (2006.01)

(52) U.S. Cl.
  CPC ........ *H02M 1/322* (2021.05); *H01L 27/0288* (2013.01); *H02M 1/0009* (2021.05); *H02M 1/0012* (2021.05)

(58) Field of Classification Search
  CPC . H01L 27/0288; H02M 1/0009; H02M 1/322; H02M 1/0012
  See application file for complete search history.

(56) References Cited

U.S. PATENT DOCUMENTS

| | | | | |
|---|---|---|---|---|
| 2009/0040668 A1* | 2/2009 | Chen | ................ | H01L 27/0285 361/56 |
| 2010/0149704 A1* | 6/2010 | Moon | ................ | H01L 27/0266 361/56 |
| 2010/0259858 A1* | 10/2010 | Huang | ................ | G11C 5/005 361/56 |
| 2011/0026176 A1* | 2/2011 | Kim | ................ | H01L 27/0266 361/56 |
| 2013/0050887 A1* | 2/2013 | Fan | ................ | H01L 27/0262 361/57 |
| 2014/0268441 A1* | 9/2014 | Mallikarjunaswamy | ................ | H02H 3/44 361/56 |
| 2014/0355157 A1* | 12/2014 | Huang | ................ | H02H 9/041 361/56 |
| 2015/0077886 A1* | 3/2015 | Chen | ................ | H02H 9/046 361/56 |
| 2015/0380397 A1* | 12/2015 | Dabral | ................ | H01L 27/0255 361/56 |
| 2016/0372918 A1* | 12/2016 | Chen | ................ | H02H 9/046 |
| 2017/0288398 A1* | 10/2017 | Worley | ................ | H03K 19/018528 |
| 2019/0190256 A1* | 6/2019 | Agarwal | ................ | H02H 9/046 |
| 2020/0153241 A1* | 5/2020 | Mathur | ................ | H01L 27/0285 |
| 2021/0066276 A1* | 3/2021 | Kim | ................ | H10B 43/40 |
| 2021/0281066 A1* | 9/2021 | Lee | ................ | H01L 27/0266 |
| 2021/0408786 A1* | 12/2021 | Dundigal | ................ | H03K 17/0822 |

(Continued)

FOREIGN PATENT DOCUMENTS

| | | | | |
|---|---|---|---|---|
| CN | 105449315 A | * | 3/2016 | .......... H01M 10/615 |
| CN | 210838938 U | * | 6/2020 | |
| CN | 114527472 A | * | 5/2022 | |

(Continued)

*Primary Examiner* — Sisay G Tiku

(74) *Attorney, Agent, or Firm* — Charles F. Koch; Frank D. Cimino

(57) ABSTRACT

In one example, a circuit comprises: a controller, an electrostatic discharge (ESD) circuit, and a driver circuit. The controller has a driver control output. The ESD circuit has a driver control input and an ESD output, the driver control input coupled to the driver control output. The driver circuit has a driver input and a driver output, the driver input coupled to the ESD output.

18 Claims, 20 Drawing Sheets

(56) References Cited

U.S. PATENT DOCUMENTS

2022/0416536 A1 * 12/2022 Krishnamoorthy ...... H02H 9/02

FOREIGN PATENT DOCUMENTS

| CN | 115699313 A | * | 2/2023 | ......... H01L 27/0292 |
| KR | 102140734 B1 | * | 8/2022 | |
| TW | 202209787 A | * | 3/2022 | .......... H02M 1/0061 |

* cited by examiner

US 11,923,764 B1

ELECTROSTATIC DISCHARGE CIRCUIT FOR SWITCHING MODE POWER SUPPLY

BACKGROUND

A switched mode power supply (SMPS) uses semiconductor switching techniques to transfer power from a power source to a load. The SMPS may include an energy storage element (such as an inductor, a capacitor, a transformer, etc.) and switches. Through the repetitive enabling and disabling of the switches, the energy storage element can continuously switch between a charging state and a discharging state in each switching cycle. The SMPS may also include driver circuits to enable/disable the switches, and a controller that control the driver circuits. The controller of the SMPS can determine the on-time and off-time of the switches, which can reflect the time durations of the charging and discharging states in a switching cycle, so the SMPS can provide a desired power to the load. The switches, the driver circuits, and the controller can be in an integrated circuit. The integrated circuit can be electrically connected between the power source and the load to perform the power transfer.

The integrated circuit can be susceptible to an electrostatic discharge (ESD) event. The ESD event can occur when the integrated circuit is handled or otherwise comes into contact with another object that has electrostatic charge. The ESD event can introduce a large voltage across the semiconductor devices of the integrated circuit, and cause a large current to flow through those devices, both of which can introduce failures in the semiconductor devices.

SUMMARY

A circuit comprises a controller, an electrostatic discharge (ESD) circuit, and a driver circuit. The controller has a driver control output. The ESD circuit has a driver control input and an ESD output, the driver control input coupled to the driver control output. The driver circuit has a driver input and a driver output, the driver input coupled to the ESD output.

An integrated circuit comprises a controller, a first ESD circuit, a second ESD circuit, a voltage regulator, a first driver circuit, a second driver circuit, a first transistor, and a second transistor. The controller has a first driver control output and a second driver control output. The first ESD circuit has a first driver control input and a first ESD output, the first driver control input coupled to the first driver control output. The second ESD circuit has a second driver control input and a second ESD output, the second driver control input coupled to the second driver control output. The first driver circuit is coupled between an internal supply voltage terminal and a switching terminal and has a first driver input and a first driver output. The first driver input is coupled to the first ESD output. The second driver circuit is coupled between the regulator output and a rectifier terminal and has a second driver input and a second driver output. The second driver input is coupled to the second ESD output. The first transistor is coupled between an input voltage terminal and the switching terminal and has a first control terminal coupled to the first driver output. The second transistor is coupled between the switching terminal and the rectifier terminal and has a second control terminal coupled to the second driver output.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
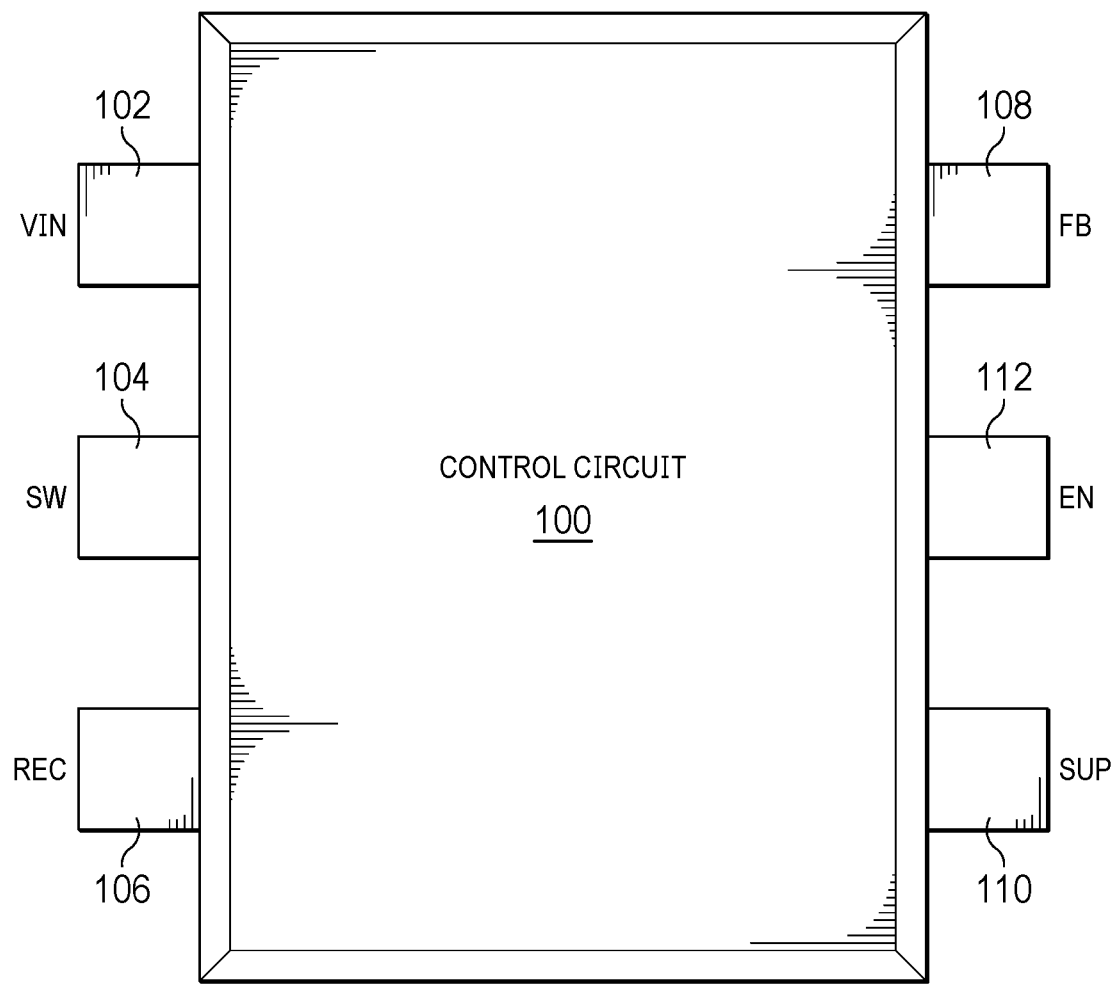
FIG. 1 illustrates schematics of an example control of a switched mode power supply (SMPS).

FIG. 1 illustrates schematics of an example control circuit 100 that can be part of a switched mode power supply (SMPS). Referring to FIG. 1, control circuit 100 can be part of an integrated circuit including an input voltage terminal 102 (labelled VIN), a switching terminal 104 (labelled SW), a rectifier terminal 106 (labelled REC), and a feedback terminal 108 (labelled FB). Control circuit 100 can also include an internal voltage supply terminal 110 (labelled SUP), and an enable terminal 112 (labelled EN). Each of terminals 102 through 112 can be in the form of a pin, a lead, a solder ball, a flat contact, or any type of structure to provide an electrical connection between an external device and internal components of control circuit 100. In some examples, control circuit 100 can be mounted on a printed circuit board (PCB) via terminals 102 through 112.

Figure 2:
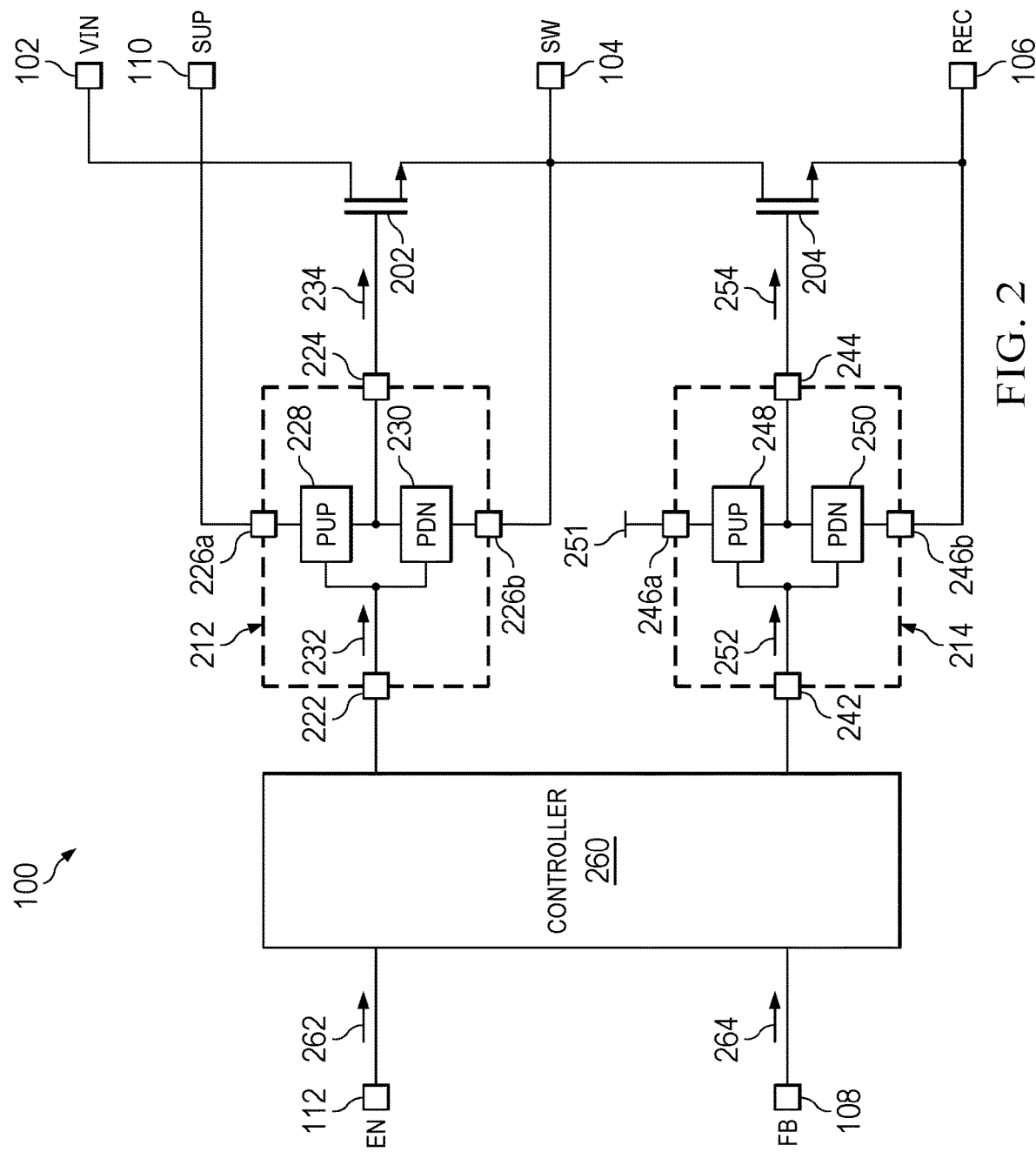
FIG. 2 illustrates schematics of example internal components of the control circuit of FIG. 1.

FIG. 2 illustrates schematics of example internal components of control circuit 100. Referring to FIG. 2, control circuit 100 can include a switch 202 coupled between input voltage terminal 102 (VIN) and switching terminal 104 (SW), and a switch 204 coupled between switching terminal 104 and rectifier terminal 106 (REC). In a SMPS, the VIN terminal can be coupled to a power source (e.g., a battery), and the SW terminal can be coupled to an energy storage element (e.g., an inductor). Switch 202 can operate as a main switch to control the flow of current from the power source to charge or discharge the energy storage element. Also, switch 204 can operate as a rectifier to control the flow of current from the energy storage element to a load. Each of switches 202 and 204 can include a respective transistor, such as field effect transistor (FET). In some examples (not shown in the figures), switches 202 and 204 can be external to control circuit 100.

Also, control circuit 100 can include driver circuits 212 and 214 to drive respective switches 202 and 204. Driver circuit 212 can include a driver input 222, a driver output 224, voltage terminals 226a and 226b, a pull-up circuit 228 and a pull-down circuit 230. Voltage terminal 226a can be coupled to the SUP terminal (internal voltage supply terminal 110), voltage terminal 226b can be coupled to the SW terminal (switching terminal 104), and driver output 224 can be coupled to a control terminal (e.g., gate) of switch 202. Pull-up circuit 228 can be coupled between voltage terminal 226a and driver output 224, and pull-down circuit 230 can be coupled between driver output 224 and voltage terminal 226b. Driver circuit 212 can receive a control signal 232 from controller 220 and, depending on the state of control signal 232, can enable one of pull-up circuit 228 or pull-down circuit 230. By enabling pull-up circuit 228 and disabling pull-down circuit 230, driver circuit 212 provide a control signal 234 having a first state (e.g., having the same voltage as VIN terminal) to enable switch 202. Also, by enabling pull-down circuit 230 and disabling pull-up circuit 228, driver circuit 212 can provide control signal 234 having a second state (e.g., having the same voltage as SW terminal) to disable switch 202.

Also, driver circuit 214 can include a driver input 242, a driver output 244, voltage terminals 246a and 246b, a pull-up circuit 248 and a pull-down circuit 250. Voltage terminal 246a can be coupled to another internal voltage supply 251, which can be provided by an internal voltage regulator of control circuit 100 (not shown in the figures), or can be derived from a voltage at the SUP terminal. Voltage terminal 246b can be coupled to the REC terminal (rectifier terminal 106). Also, driver output 244 can be coupled to a control terminal (e.g., gate) of switch 204. Pull-up circuit 248 can be coupled between voltage terminal 246a and driver output 244, and pull-down circuit 250 can be coupled between driver output 244 and voltage terminal 246b. Driver circuit 214 can receive a control signal 252 from controller 220 and, depending on the state of control signal 252, can enable one of pull-up circuit 248 or pull-down circuit 250. By enabling pull-up circuit 248 and disabling pull-down circuit 250, driver circuit 214 provide a control signal 254 having a first state (e.g., having the same voltage as SW) to enable switch 204. Also, by enabling pull-down circuit 250 and disabling pull-up circuit 248, driver circuit 214 can provide control signal 254 having a second state (e.g., having the same voltage as REC terminal) to disable switch 204.

In addition, control circuit 100 can include a controller 260. Controller 260 can receive an enable signal 262 from enable terminal 112 and a feedback signal 264 from feedback terminal 108, and generate control signals 232 and 252 based on the states of enable signal 262 and feedback signal 264. For example, enable signal 262 can indicate whether the SMPS is to be enabled. Also, feedback signal 264 can represent an output voltage of SMPS to the load. If the SMPS is to be enabled, controller 260 can generate control signals 222 and 224 to control the turn-on and turn-off durations of switches 202 and 204 based on feedback signal 264 to regulate the output voltage. But if the SMPS is to be disabled, controller 260 can generate control signals 232 and 252 to disable driver circuits 212 and 214 and/or disable switches 202 and 204.

Figure 3:
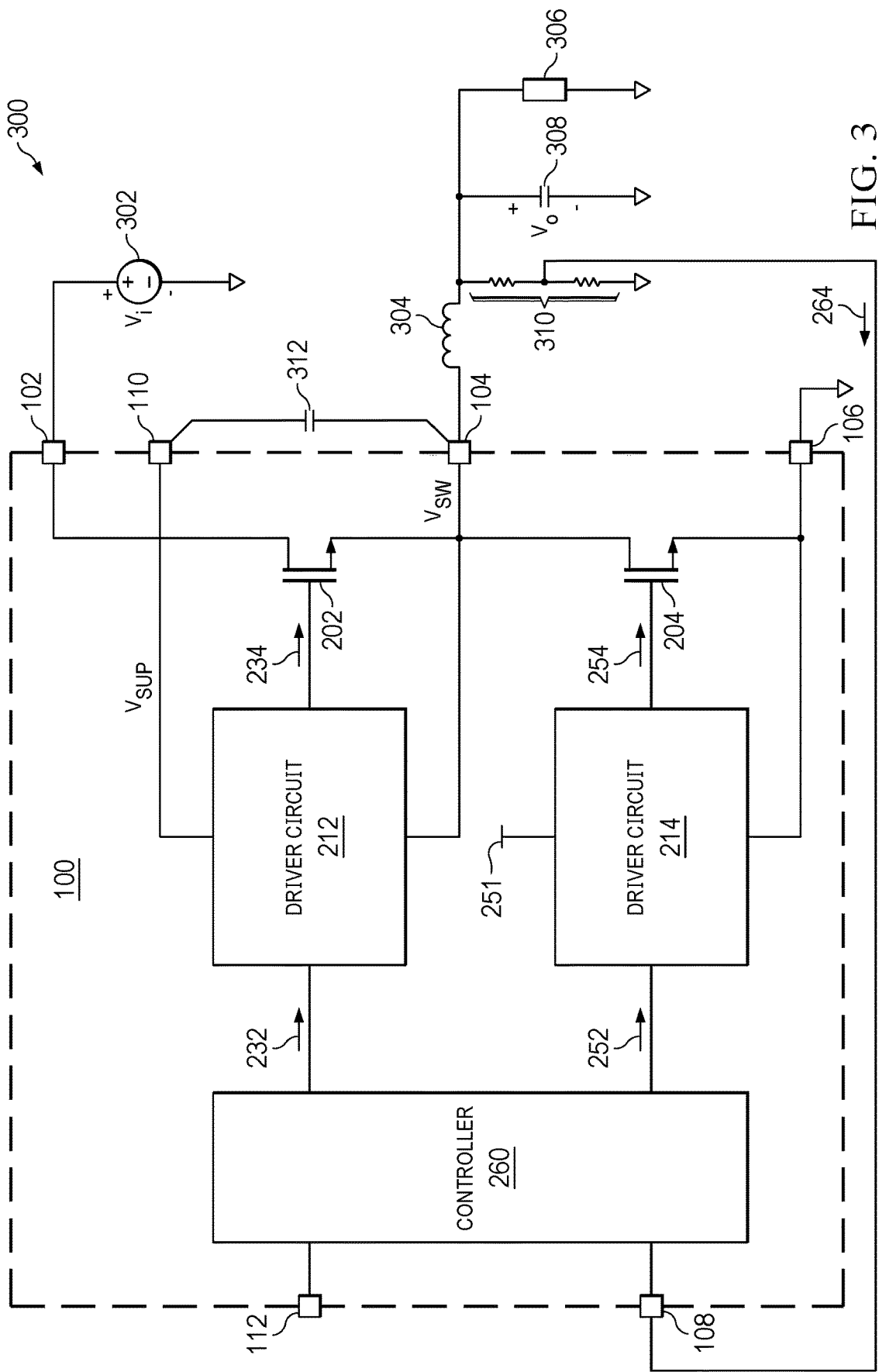
FIG. 3 illustrates schematics of an example SMPS including the control circuit of FIG. 1.

FIG. 3 illustrates schematics of an example SMPS 300 including control circuit 100. Referring to FIG. 3, input voltage terminal 102 of control circuit 100 can be coupled to a power source 302, which supplies an input voltage $V_i$. SMPS 300 can also include an inductor 304, which operates as an energy storage element, coupled between switching terminal 104 of control circuit 100 and a load 306 and a holding capacitor 308. Also, rectifier terminal 106 can be coupled to ground. SMPS 300 can transfer power from power source 302 to load 306 and holding capacitor 308 by providing an output voltage $V_o$ based on input voltage $V_i$.

In FIG. 3, SMPS 300 is configured as a buck converter that generates the output voltage $V_o$ as a step-down version of input voltage $V_i$. SMPS 300 can provide control signals 232 and 252 as multi-cycle signals, and can set the ratio between output voltage $V_o$ and input voltage $V_i$ by setting the duty cycles of control signals 232/234 and 252/254. SMPS 300 can include a voltage divider 310 having an input coupled to inductor 304 and an output coupled to feedback terminal 108 of control circuit 100. Voltage divider 310 can generate feedback signal 264 that represents output voltage Vo, and provide feedback signal 264 to controller 260. Controller 260 can modulate the duty cycles of control signals 232 and 252 based on feedback signal 264 to regulate output voltage $V_o$ at a target voltage.

Also, SMPS 300 can also include a capacitor 312 coupled between internal voltage supply terminal 110 and switching terminal 104. Capacitor 312 can operate as a charge pump to provide an internal supply voltage $V_{SUP}$ for driver circuit 212 from a switching voltage $V_{SW}$ at switching terminal 104. As switching voltage $V_{SW}$ switches between states (e.g., between the input voltage $V_i$ and ground voltage), charge can be added to capacitor 312 to increase $V_{SUP}$ to a level above the input voltage $V_i$.

Figure 4:
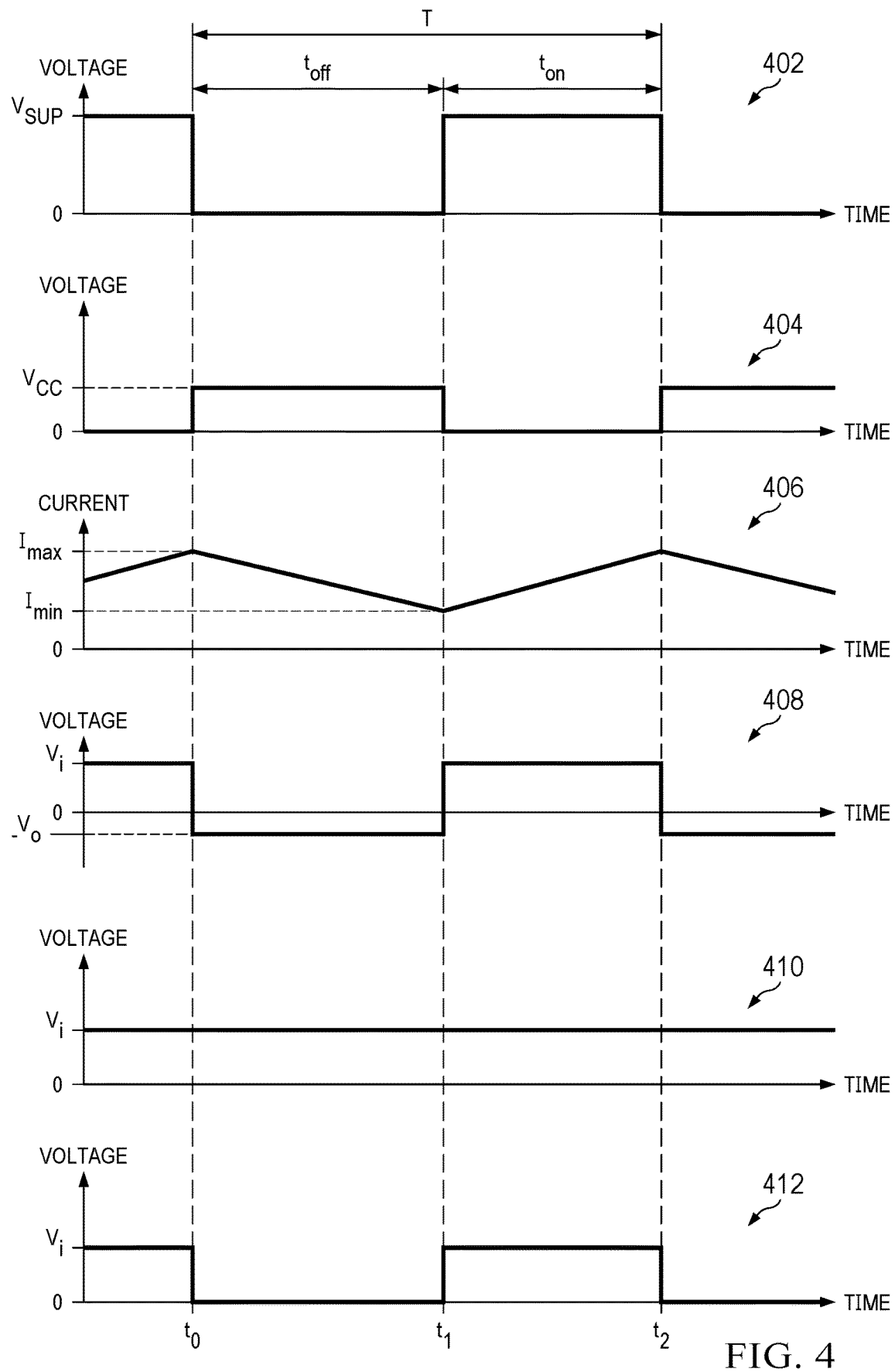
FIG. 4 includes waveform graphs that illustrate example operations of the SMPS of FIG. 3

FIG. 4 includes waveform graphs that illustrates example operations of SMPS 300. In FIG. 4, graph 402 represents the time-variation of control signal 234 provided by driver circuit 212 to switch 202, and graph 404 represents the time-variation of control signal 254 provided by driver circuit 214 to switch 204. Also, graph 406 represents the time-variation of an inductor current that flows from switching terminal 104 to load 306 across inductor 304, and graph 408 represents the time-variation of a voltage across inductor 304. Further, graph 410 represents the time-variation of a voltage at input voltage terminal 102, which is substantially constant at $V_i$, and graph 412 represents the time variation of switching voltage $V_{SW}$ at switching terminal 104.

FIG. 4 illustrates a switching cycle of switches 202 and 204 has a cycle period of T, and the switching cycle spans from time $T_0$ through time $T_1$ and ends at time T2. The period between $T_0$ and $T_1$ is an off-time for switch 202 (and an on-time for switch 204) and has a duration of $t_{off}$, and the period between $T_1$ and $T_2$ is an on-time for switch 202 (and an off-time for switch 204) and has a duration of $t_{on}$. A ratio between $t_{on}$ and T can represent the duty cycle and can set the ratio between output voltage $V_o$ and input voltage $V_i$.

Between $T_0$ and $T_1$, pull-up circuit 248 of driver circuit 214 can be enabled and pull-down circuit 250 of driver circuit 214 can be disabled. Accordingly, driver circuit 214 can set control signal 254 to a $V_{CC}$ voltage provided by internal voltage supply 251 and enable switch 204, and switching voltage $V_{SW}$ drops to the ground voltage (e.g., zero volt) between $T_0$ and $T_1$. Also, pull-up circuit 228 of driver circuit 212 can be disabled, and pull-down circuit 230 of driver circuit 212 can be enabled. Accordingly, driver circuit 212 can set control signal 234 to the $V_{SW}$ voltage (zero volt) and disable switch 202. Between $T_0$ and $T_1$, inductor 304 can discharge, the inductor current drops from a maximum value ($I_{max}$) to a minimum value ($I_{min}$), and the voltage across inductor 304 can be equal to negative $V_o$. Also, holding capacitor 308 can discharge to provide current to load 306 and to maintain the voltage across load 306 around positive $V_o$.

Also, between $T_1$ and $T_2$, pull-up circuit 248 of driver circuit 214 can be disabled and pull-down circuit 250 of driver circuit 214 can be enabled. Accordingly, driver circuit 214 can set control signal 254 to the ground voltage and disable switch 204. Also, pull-up circuit 228 of driver circuit 212 can be disabled, and pull-down circuit 230 of driver circuit 212 can be enabled. Accordingly, driver circuit 212 can set control signal 234 to the $V_{SUP}$ voltage and enable switch 202. The enabled switch 204 can bring the $V_{SW}$ voltage to be equal to the input voltage $V_i$. Between $T_1$ and $T_2$, inductor 304 can charge, the inductor current increases from a minimum value ($I_{min}$) to a maximum value ($I_{max}$), and the voltage across inductor 304 can be equal to negative $V_i$-$V_o$. Holding capacitor 308 can also maintain the voltage across load 306 around positive $V_o$.

Figure 5:
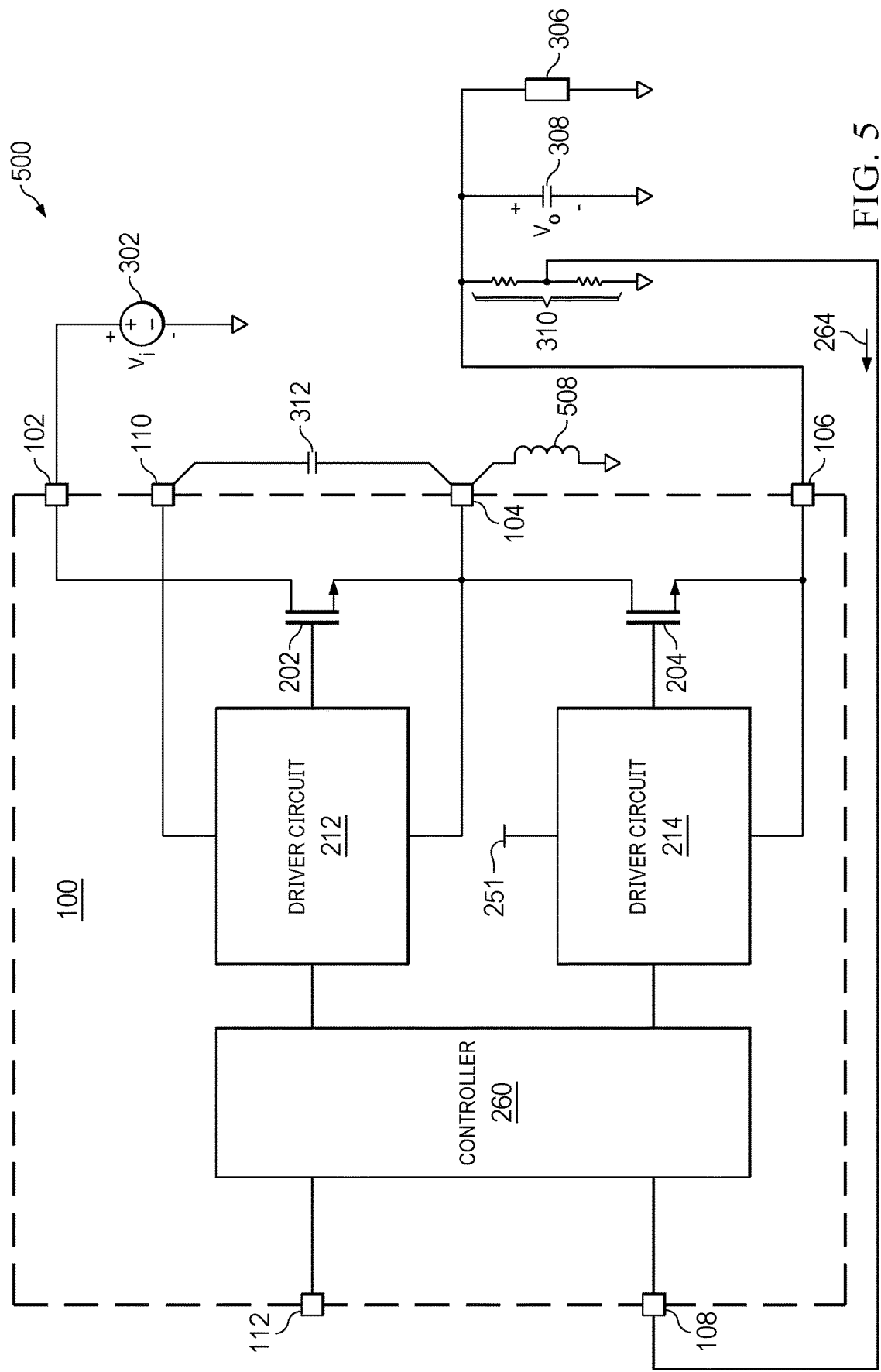
FIG. 5 illustrates schematics of another example SMPS including the control circuit of FIG. 1.

FIG. 5 illustrates schematics of another example SMPS 500 including control circuit 100. Referring to FIG. 5, input voltage terminal 102 of control circuit 100 can be coupled to power source 302, which supplies the input voltage $V_i$. SMPS 500 can also include an inductor 508, which operates as an energy storage element, coupled to switching terminal 104. Also, load 306, holding capacitor 308, and voltage divider 310 can be coupled to rectifier terminal 106. SMPS 500 can also include capacitor 312 coupled between internal supply voltage terminal 110 and switching terminal 104. In FIG. 5, SMPS 500 can be a buck-boost converter that generates the output voltage $V_o$ as a step-down or step-up version of the input voltage $V_i$. Based on feedback signal 264, controller 206 can determine the ratio between the output voltage $V_o$ and the input voltage $V_i$ by setting the duty cycles of control signals 232/234 and 252/254.

Control circuit 100 can be susceptible to an electrostatic discharge (ESD) event. During an ESD event, a large amount of electrostatic charge can be transferred from another object to control circuit 100 within a short period of time. The ESD event can occur when the integrated circuit including control circuit 100 is handled or otherwise comes into contact with the other object that has electrostatic charge. For example, when input voltage terminal 102 is electrically connected to a power source, such as when the integrated circuit is mounted on a printed circuit board or wired to the power source, a large amount of electrostatic charge can be transferred via input voltage terminal 102 into control circuit 100 within a short period of time.

Figure 6:
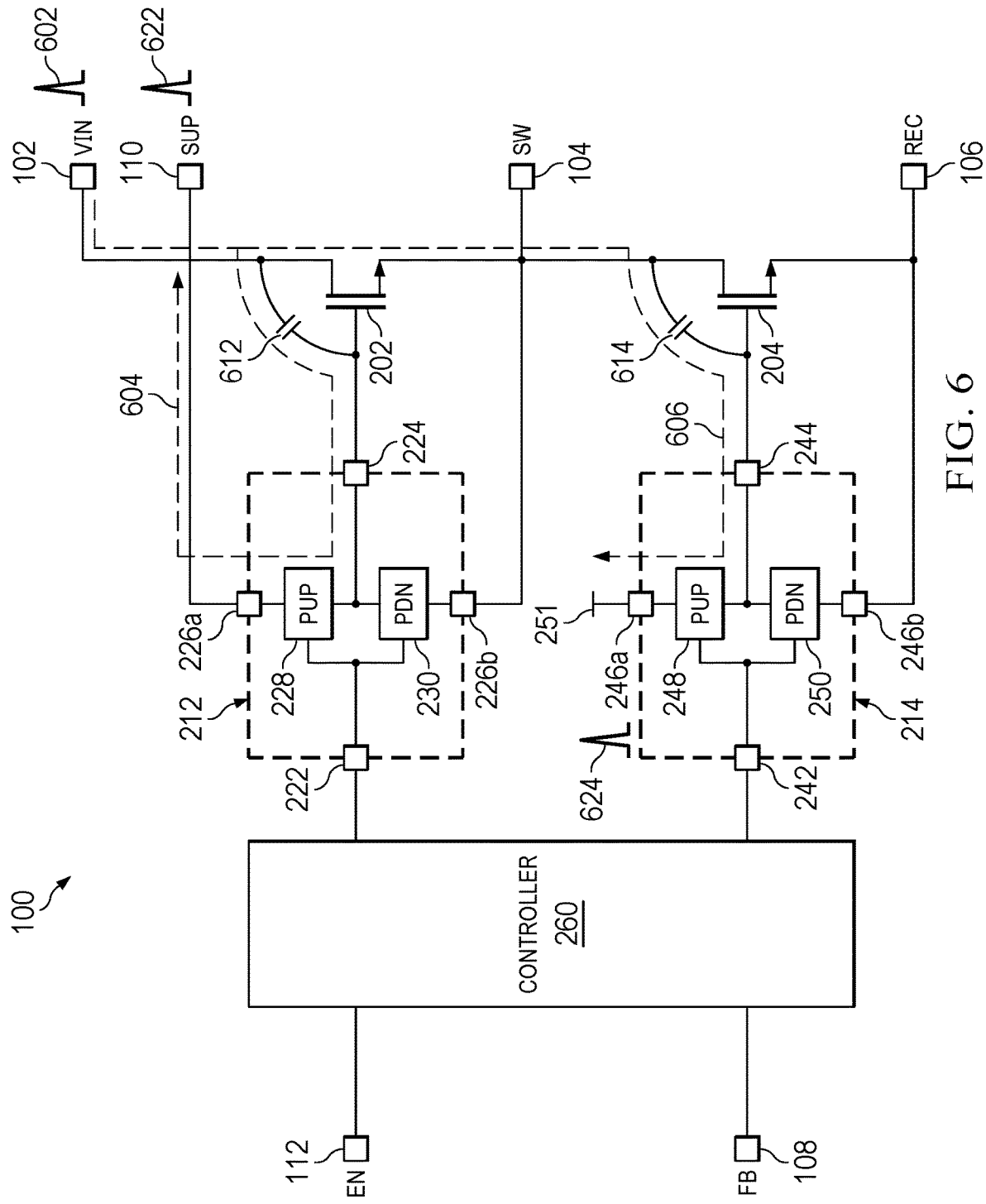
FIG. 6 and FIG. 7 illustrate example impacts of an electrostatic discharge (ESD) event on the control circuit of FIG. 1.
Figure 7:
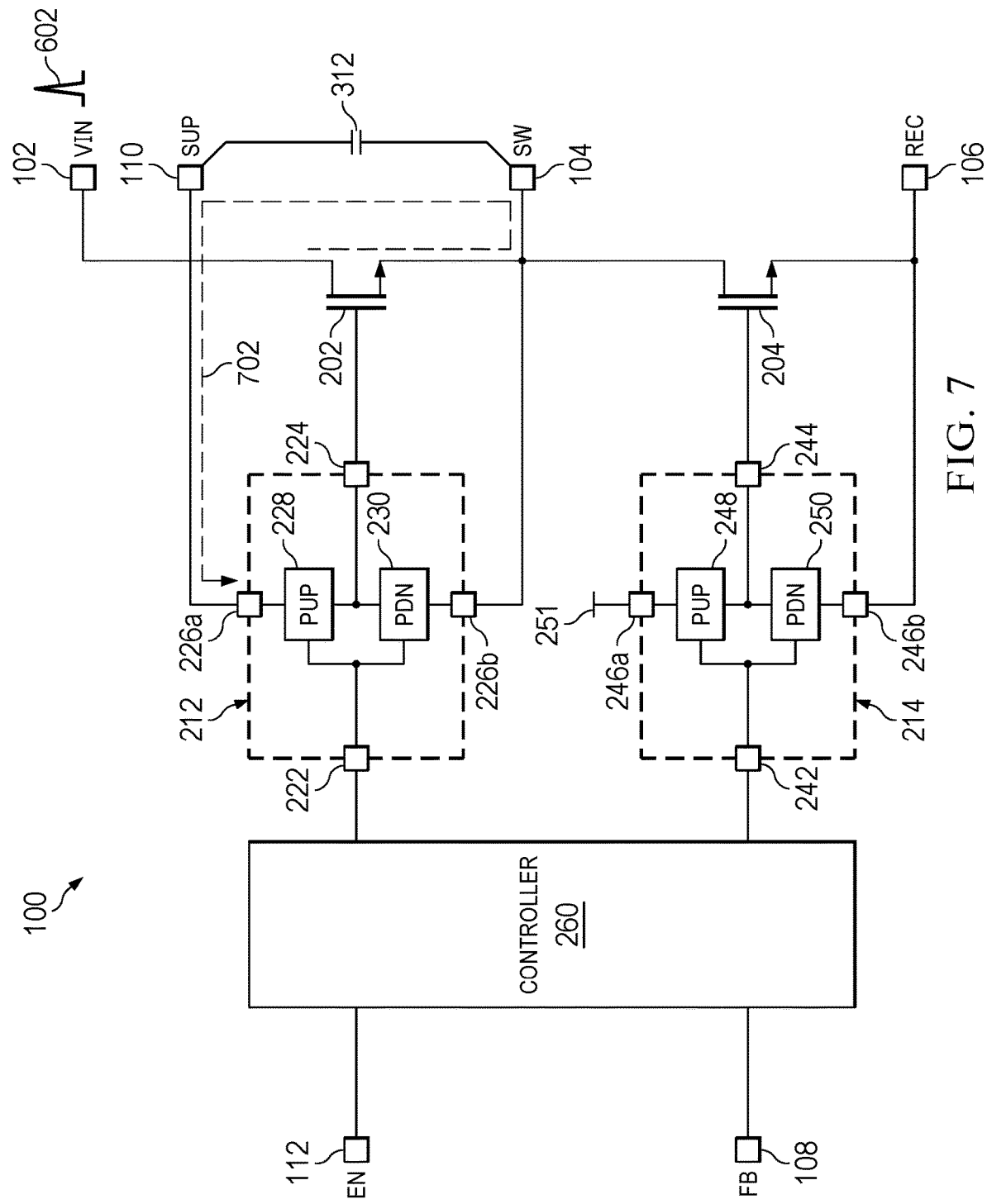

The ESD event can introduce a large voltage across the semiconductor devices of the integrated circuit including those of control circuit 100, and cause a large current to flow through those devices, both of which can cause failure in the semiconductor devices. FIG. 6 and FIG. 7 illustrate example impacts of an ESD event at input voltage terminal 102 on control circuit 100. Referring to FIG. 6, input voltage terminal 102 may receive an ESD signal 602, which may include a pulse of electrostatic charge. ESD signal 602 can propagate through a path 604 to reach internal voltage supply terminal 110, and propagate through path 606 to reach internal voltage supply 251. Specifically, switches 202 and 204 can include respective parasitic capacitances 612 and 614 along paths 604 and 606. In a case where switches 202 and 204 include a respective NFET, each of parasitic capacitances 612 and 614 can be a gate-drain capacitance ($C_{GD}$) of the NFET. From input voltage terminal 102, ESD signal 602 can propagate through parasitic capacitance 612 and deposit charge at the gate/control terminal of switch 202, which increases the voltage of driver output 224 of driver circuit 212. Pull-up circuit 228 of driver circuit 212 can transmit the increased voltage as an ESD voltage signal 622 through voltage terminal 226a to internal voltage supply terminal 110.

Also, the increased voltage of driver output 224 can enable switch 202, and the enabled switch 202 can transmit ESD signal 602 to switching terminal 104. From switching terminal 104, ESD signal 602 can propagate through parasitic capacitance 614 and deposit charge at the gate/control terminal of switch 204, which increases the voltage of driver output 244 of driver circuit 214. Pull-up circuit 248 of driver circuit 214 can transmit the increased voltage as an ESD voltage signal 624 through voltage terminal 246a to internal voltage supply 251.

The propagation of the ESD signals can increase the voltages at internal voltage supply terminal 110 and internal voltage supply 251, which can create voltage stress on semiconductor devices that are coupled to and receive power from internal voltage supply terminal 110 and internal voltage supply 251. For example, in addition to pull-up circuit 228, control circuit 100 can include other circuits that are coupled to internal voltage supply terminal 110, such as level shifter circuit and buffer circuit. Also, controller 260 can receive power from internal voltage supply 251. Control circuit 100 may also include a voltage regulator to provide internal voltage supply 251. All these circuits can be susceptible to voltage stress if the voltages at internal voltage supply terminal 110 and internal voltage supply 251 are increased by the ESD signal. The voltage stress can cause the semiconductor devices to fail, or at least reduce the life time of the semiconductor devices and degrade the reliability of control circuit 100.

FIG. 7 illustrates another example impact of an ESD event at input voltage terminal 102 on control circuit 100. Referring to FIG. 7, an SMPS may include capacitor 312 coupled between switching terminal 104 and internal voltage supply terminal 110. Also, as described above, ESD signal 602 can propagate through parasitic capacitance 612 and deposit charge at the gate/control terminal of switch 202, which increases the voltage of driver output 224 of driver circuit 212 and enable switch 202. The enabled switch 202 and capacitor 312 can form a current path 702. Through current path 702, ESD signal 602 can propagate, and a large ESD current can flow from input voltage terminal 102 through switch 202, capacitor 312, voltage terminal 226a, and reach driver circuit 212. The large ESD current can also damage the semiconductor devices of driver circuit 212.

Figure 8:
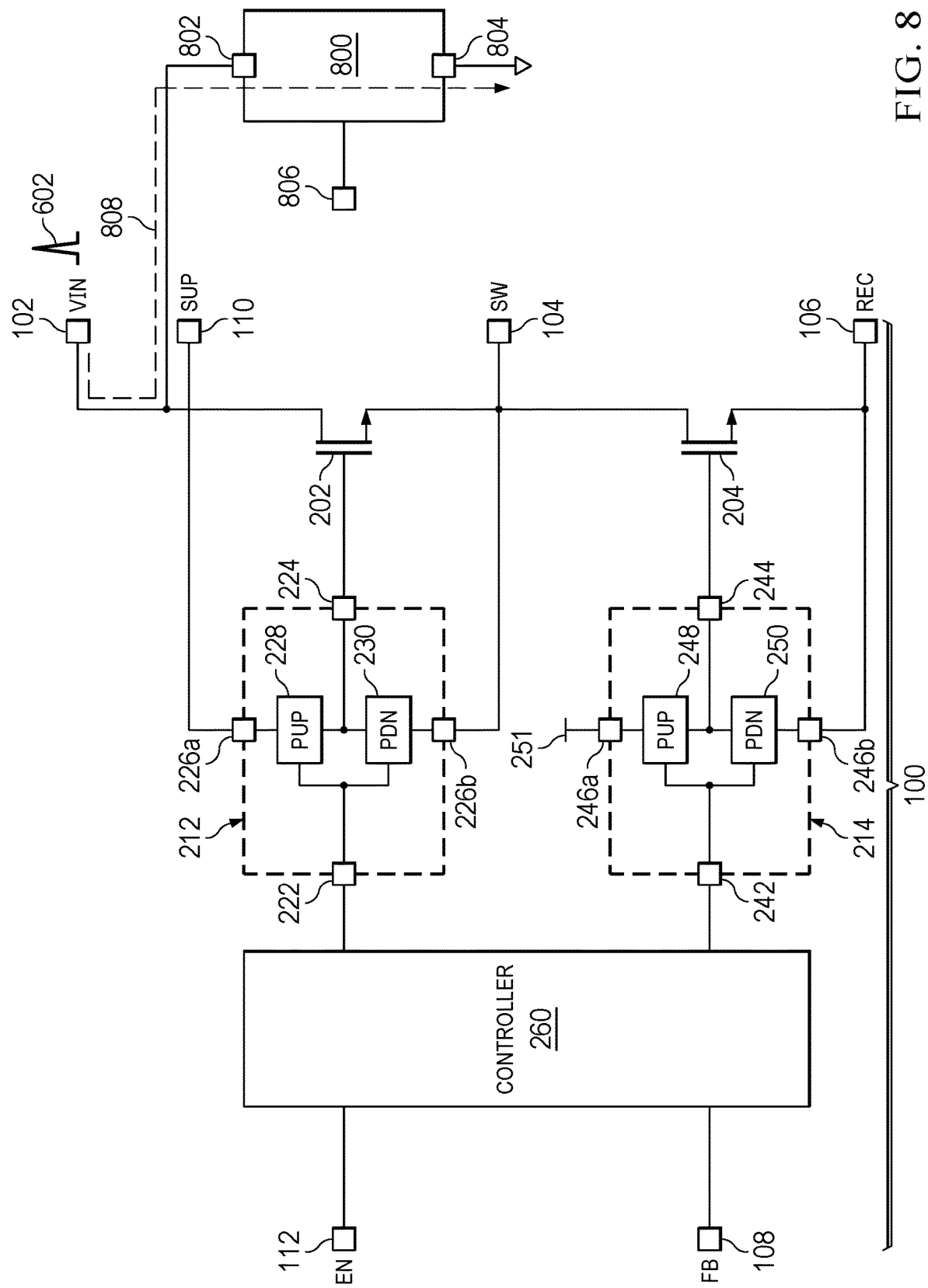
FIG. 8 and FIG. 9 illustrate schematics of an example ESD circuit.
Figure 9:
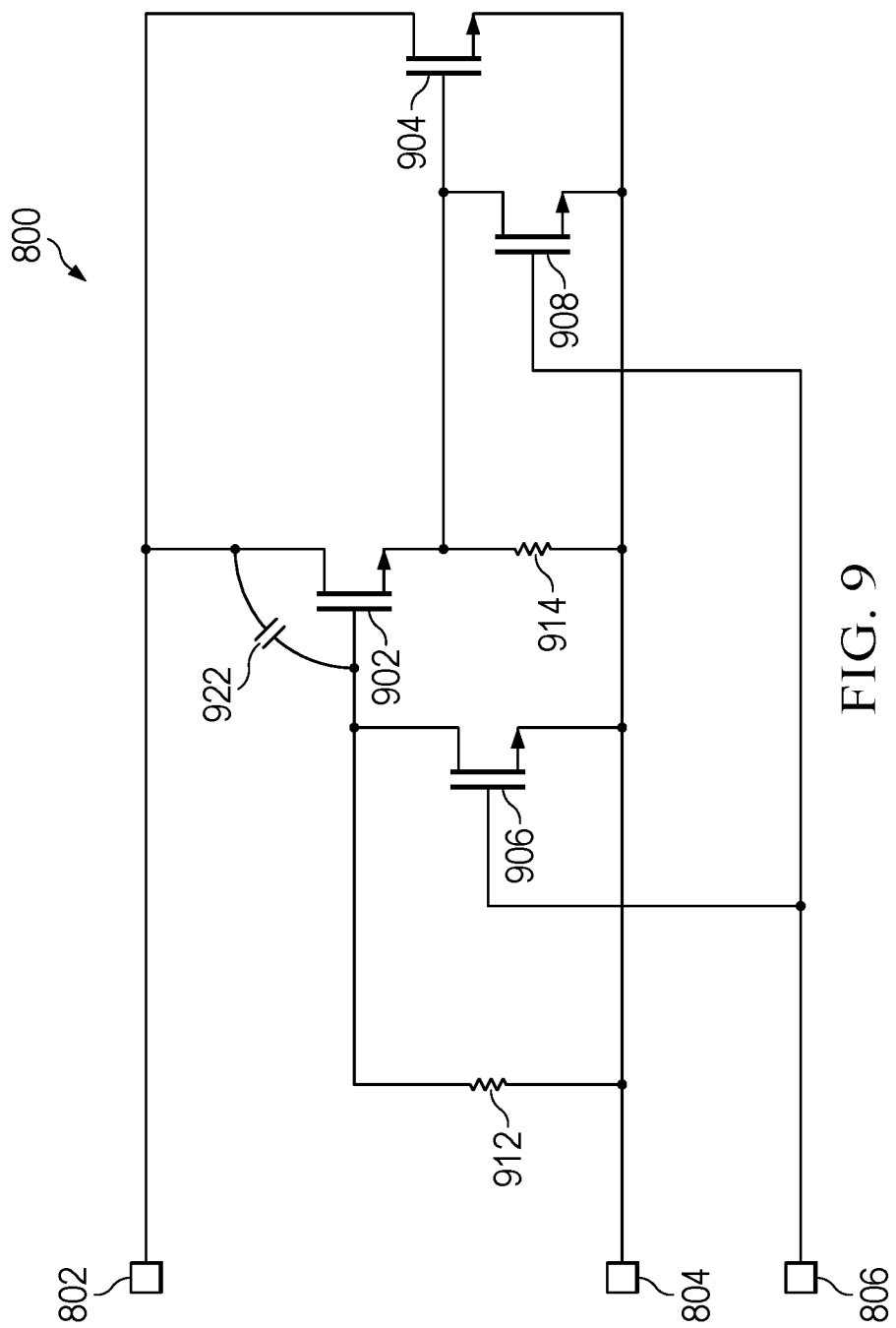

FIG. 8 and FIG. 9 illustrate examples of an ESD circuit 800 that can mitigate the impact of an ESD event on control circuit 100. Referring to FIG. 8, ESD circuit 800 can be external to control circuit 100 and include an input terminal 802, a charge draining terminal 804, and a control input 806. Input terminal 802 of ESD circuit 800 can be coupled to input voltage terminal 102, and charge draining terminal 804 can be coupled to ground. Control input 806 can receive a control signal, which can indicate whether ESD circuit 800 is enabled or disabled. When ESD circuit 800 is enabled, ESD circuit 800 can provide a current path 808 to remove some or all of the electrostatic charge of ESD signal 602 from input voltage terminal 102 via input terminal 802, and drain the charge via charge drain terminal 804 to ground. Accordingly, none (or a reduced amount) of the electrostatic charge of ESD signal 602 reaches at internal voltage supply terminal 110 and internal voltage supply 251, which can reduce the voltage stress and ESD current in control circuit 100 caused by the ESD event.

FIG. 9 illustrates example internal components of ESD circuit 800. Referring to FIG. 9, ESD circuit 800 can include transistors 902, 904, 906, and 908, and resistors 912 and 914. Transistors 902 through 908 can be FET, such as NFET. First current terminals (e.g., drain) of transistors 902 and 904 can be coupled to input terminal 802. A second current terminal (e.g., source) of transistor 902 can be coupled to the control terminal (e.g., gate) of transistor 904, and a second current terminal (e.g., source) of transistor 904 can be coupled to charge draining terminal 804. Also, resistor 912 can be coupled between the control terminal (e.g., gate) of transistor 902 and output terminal 804. Resistor 914 can be coupled between the second current terminal of transistor 902 and charge draining terminal 804.

Resistor 912 and parasitic capacitance 922 of transistor 902 (e.g., $C_{GD}$) can form an RC filter. When ESD signal 602 appears at input terminal 802, the electrostatic charge of ESD signal 602 can flow through parasitic capacitance 922 and resistor 912 and increase the voltage at the gate/control terminal of transistor 902, and transistor 902 can be enabled. As transistor 902 is enabled, current can flow through transistor 902 and resistor 914, and the source voltage of transistor 902 and the gate voltage of transistor 904 also increase. The increased gate voltage can enable transistor 904, which can provide current path 808 to drain the ESD charge to ground.

Also, the control terminals of transistors 906 and 908 can be coupled to control input 806. Transistor 906 can be coupled between the gate of transistor 902 and charge draining terminal 104, and transistor 908 can be coupled between the gate of transistor 904 and charge draining terminal 804. Charge draining terminal 804 can be coupled to ground. If control input 806 is in a first state (e.g., an asserted state), both transistors 906 and 908 can be enabled to pull the respective gates of transistors 902 and 904 to ground (charge draining terminal 804) and disable transistors 902 and 904. If control input 806 is in a second state (e.g., a de-asserted state), both transistors 906 and 908 can be disabled, and transistors 902 and 904 can operate responsive to an ESD event as described above.

Although ESD circuit 800 can mitigate the impact of an ESD event on control circuit 100, various issues can impact its performance in handling the ESD event. First, transistor 904 can have a large width (and a large size) to reduce the resistance, and to speed up the draining of the ESD charge quickly. But the large size of transistor 904 can substantially increase the overall die size of the integrated circuit that includes ESD circuit 800 and control circuit 100, while reducing the size of transistor 904 can slow down the removal of the ESD charge. Also, while ESD circuit 800 can divert/remove the ESD charge, it does not provide a mechanism to block the ESD charge from reaching internal voltage supply terminal 110 and internal voltage supply 251. Accordingly, large voltage and current due to the ESD event can still reach internal voltage supply terminal 110 and internal voltage supply 251, due to the delay incurred by ESD circuit 800 in removing the ESD charge.

Figure 10:
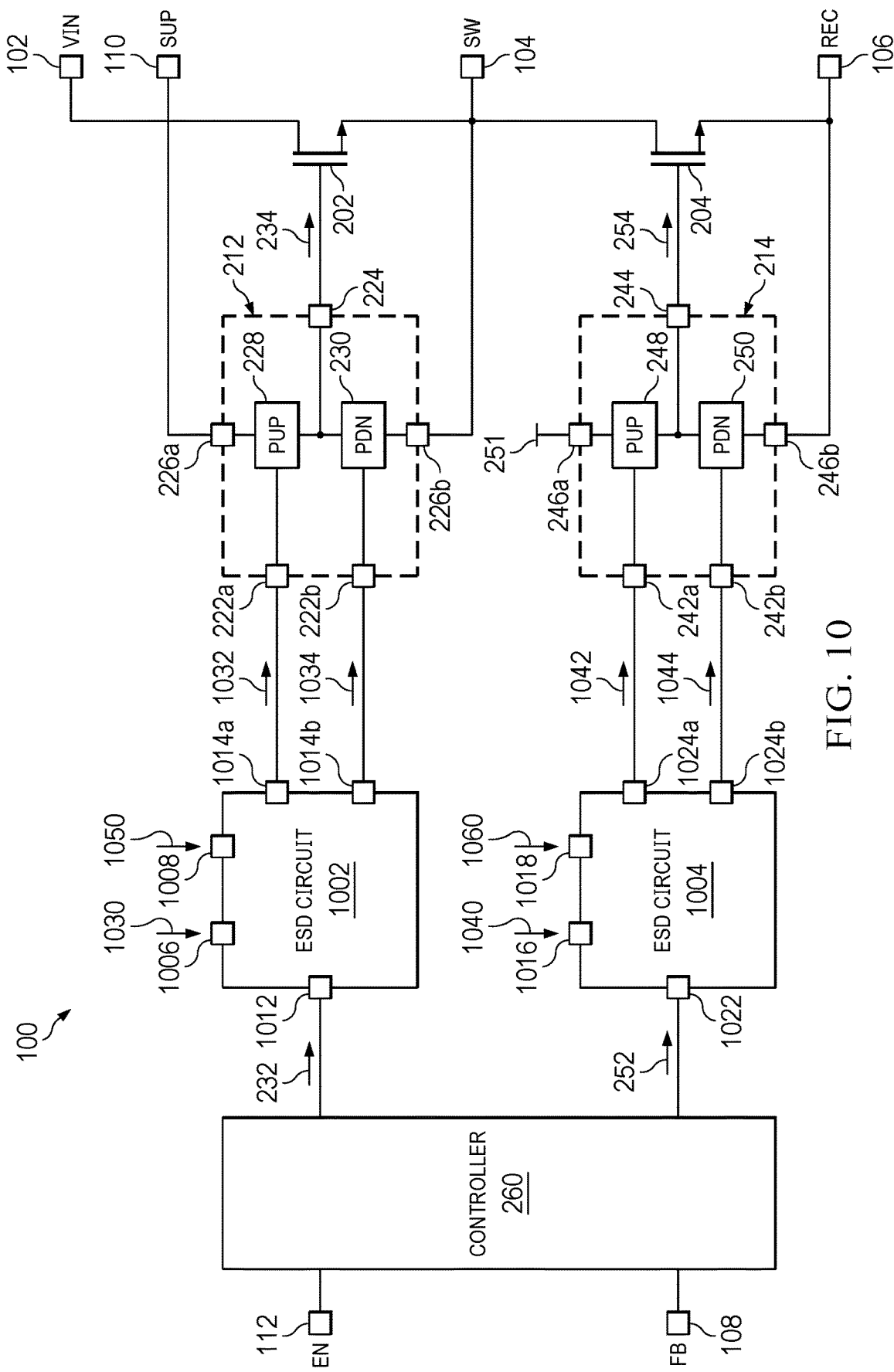
FIG. 10 illustrates schematics of example ESD circuits that are part of a control circuit of an SMPS.

FIG. 10 illustrates schematics of example ESD circuits that can address at least some of the issues described above. Referring to FIG. 10, control circuit 100 can include an ESD circuit 1002 coupled between controller 260 and driver circuit 212, and an ESD circuit 1004 coupled between controller 260 and driver circuit 214. ESD circuit 1002 can include an ESD input 1006, a control signal input 1012, and ESD control signal outputs 1014a and 1014b. ESD control signal outputs 1014a and 1014b can be coupled to respective driver inputs 222a and 222b of driver circuit 212. Also, ESD circuit 1004 can include an ESD input 1016, a driver power state input 1018, a control signal input 1022, and ESD control signal outputs 1024a and 1024b. ESD control outputs 1024a and 1024b can be coupled to respective driver inputs 242a and 242b of driver circuit 214. In some examples, ESD circuit 1002 can also include a driver power state input 1008, and ESD circuit 1004 can also include a driver power state input 1018.

ESD circuits 1002 and 1004 can receive respective signals 1030 and 1040 at respective ESD inputs 1006 and 1016. Signals 1030 and 1040 can indicate whether an ESD event occurs at input voltage terminal 102. In some examples, ESD input 1006 can be coupled to driver output 224 and ESD input 1016 can be coupled to driver output 244, where the voltages at driver outputs 224 and 244 can indicate the ESD event. In some examples, ESD input 1006 can be coupled to input voltage terminal 102 and ESD input 1016 can be coupled to switching terminal 104 to detect the ESD event. In some examples, responsive to signal 1030 indicating an ESD event, ESD circuit 1002 can provide pull-up control signal 1032 to disable pull-up circuit 228 of driver circuit 212. Also, responsive to receiving signal 1040, ESD circuit 1004 can provide pull-up control signal 1042 to disable pull-up circuit 248 of driver circuit 214.

Refer again to FIG. 6, in an ESD event, the voltages at driver outputs 224 and 244 can increase due to the coupling of the electrostatic charge through parasitic capacitance 612 of switch 202 and through parasitic capacitance 614 of switch 204. The disabling of pull-up circuit 228 by pull-up control signal 1032 can disconnect path 604 and block the increased voltage from reaching internal voltage supply terminal 110. Also, the disabling of pull-up circuit 248 by pull-up control signal 1042 can disconnect path 606 and block the increased voltage from reaching internal voltage supply 251. Accordingly, ESD circuits 1002 and 1004 can block the large voltage and current due to the ESD event from reaching the respective internal voltage supply terminal 110 and internal voltage supply 251, which can improve the protection of the devices of control circuit 100 from the ESD event.

Also, ESD circuits 1002 and 1004 can receive respective signals 1050 and 1060 at respective driver power state inputs 1008 and 1018. Both signals 1050 and 1060 can indicate whether control circuit 100 is in an enabled or a disabled state. In some examples, driver power state inputs 1008 and 1018 can be coupled to respective internal voltage supply terminal 110 and switching terminal 104, where the voltages at the terminals can indicate whether control circuit 100 is connected to a power source and is enabled to transfer power. In some examples, driver power state inputs 1008 and 1018 can also be coupled to enable terminal 112.

In some examples, ESD circuit 1002 can provide pull-down control signal 1034 to disable pull-down circuit 230 of driver circuit 212 responsive to signal 1050 indicating that control circuit 100 is in a disabled state. ESD circuit 1004 can also provide pull-down control signal 1044 to disable pull-down circuit 250 of driver circuit 214 responsive to signal 1060 indicating that control circuit 100 is in a disabled state. Such arrangements can maintain the increased voltages at driver outputs 224 and 244 to enable switches 202 and 204, which allows the switches to drain away the electrostatic charge at input voltage terminal 102 via rectifier terminal 106. In both the buck converter configuration of FIG. 3 and the buck-boost configuration of FIG. 5, rectifier terminal 106 can be coupled to ground (directly connected in FIG. 3, through voltage divider in FIG. 5), and the electrostatic charge can be drained to the ground via rectifier terminal 106. Accordingly, ESD circuits 1002 and 1004 can control switches 202 and 204 to conduct away the ESD current. Because ESD circuits 1002 and 1004 do not include additional devices to conduct away the ESD current, the overall footprint of the die including control circuit 100 and ESD circuits 1002 and 1004 can be small.

On the other hand, in a case where signals 1030 and 1040 do not indicate an ESD event, and where signals 1050 and 1060 indicate that control circuit 100 is enabled, ESD circuit 1002 can generate pull-up control signal 1032 and pull-down control signal 1034 based on control signal 232 from controller 260, and ESD circuit 1004 can generate pull-up control signal 1042 and pull-down control signal 1044 based on control signal 252 from controller 260.

Figure 11:
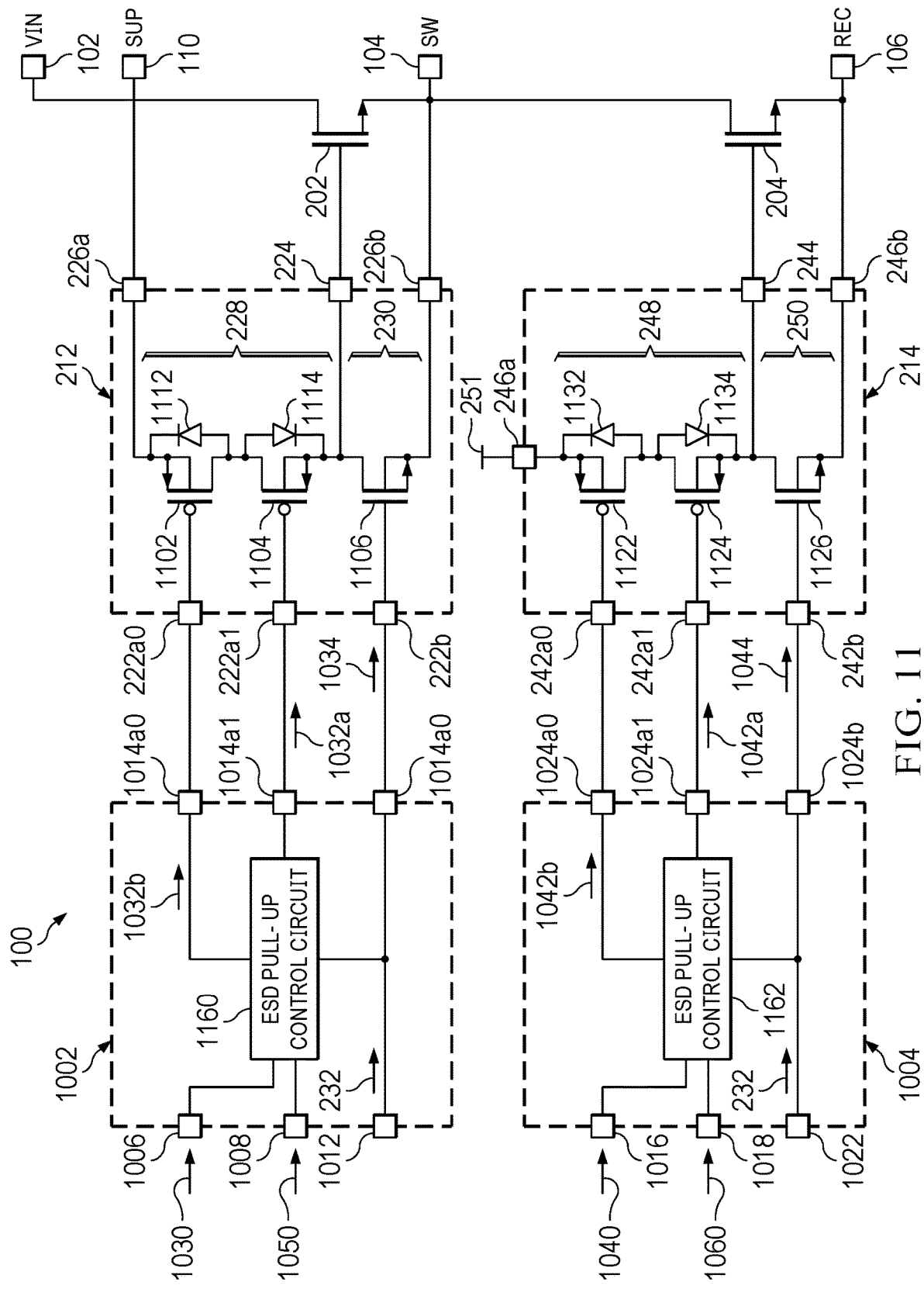
FIG. 11 illustrates schematics of example internal components of the ESD circuits of FIG. 10.
Figure 12:
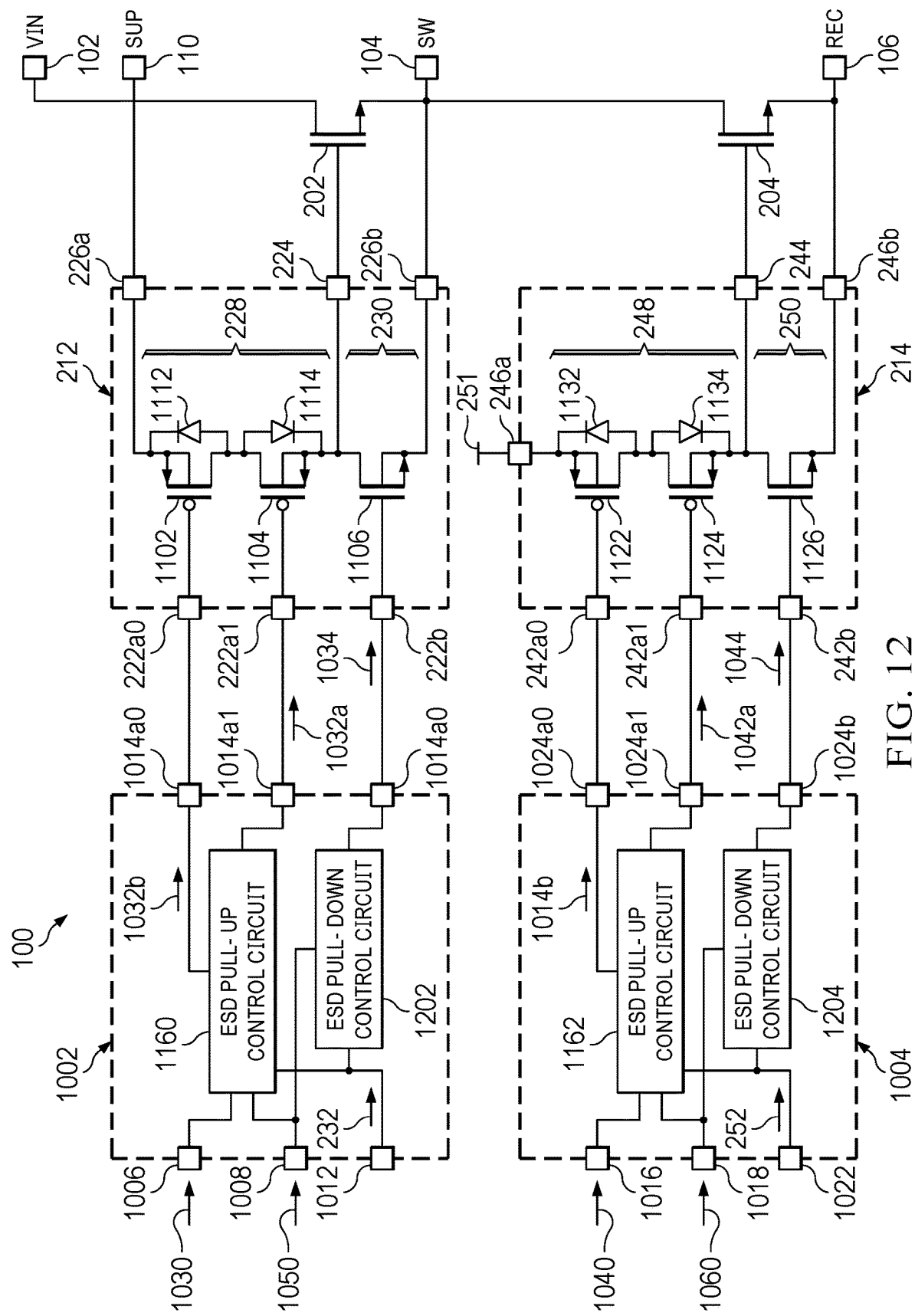
FIG. 12 illustrates schematics of example internal components of the ESD circuits of FIG. 10.

FIG. 11 and FIG. 12 illustrate examples of internal components of ESD circuits 1002, 1004, pull-up circuits 228 and 248, and pull-down circuits 230 and 250. Referring to FIG. 11 and FIG. 12, each of pull-up circuits 228 and 248 can include two PFETs coupled in series. Pull-up circuit 228 can include PFETs 1102 and 1104 coupled in series, in which a source terminal of PFET 1102 can be coupled to voltage terminal 226a and internal voltage supply terminal 110, a drain terminal of PFET 1102 can be coupled to a drain terminal of PFET 1104, and a source terminal of PFET 1104 can be coupled to driver output 224. PFETs 1102 and 1104 also include respective body diodes 1112 and 1114 coupled in series, with the anodes of body diodes 1112 and 1114 coupled together, the cathode of body diode 1112 coupled to voltage terminal 226a (and internal voltage supply terminal 110), and the cathode of body diode 1114 coupled to driver output 224. Pull-down circuit 230 can include an NFET 1106 coupled between driver output 224 and switching terminal 104.

Also, pull-up circuit 248 can include PFETs 1122 and 1124 coupled in series, in which a source terminal of PFET 1122 can be coupled to voltage terminal 246a and internal voltage supply 251, a drain terminal of PFET 1122 can be coupled to a drain terminal of PFET 1124, and a source terminal of PFET 1124 can be coupled to driver output 244. PFETs 1122 and 1124 also include respective body diodes 1132 and 1134 coupled in series, with the anodes of body diodes 1132 and 1134 coupled together, the cathode of body diode 1132 coupled to voltage terminal 246a (and internal voltage supply 251), and the cathode of body diode 1134 coupled to driver output 244. Pull-down circuit 250 can include an NFET 1126 coupled between driver output 244 and rectifier terminal 106.

Figure 13:
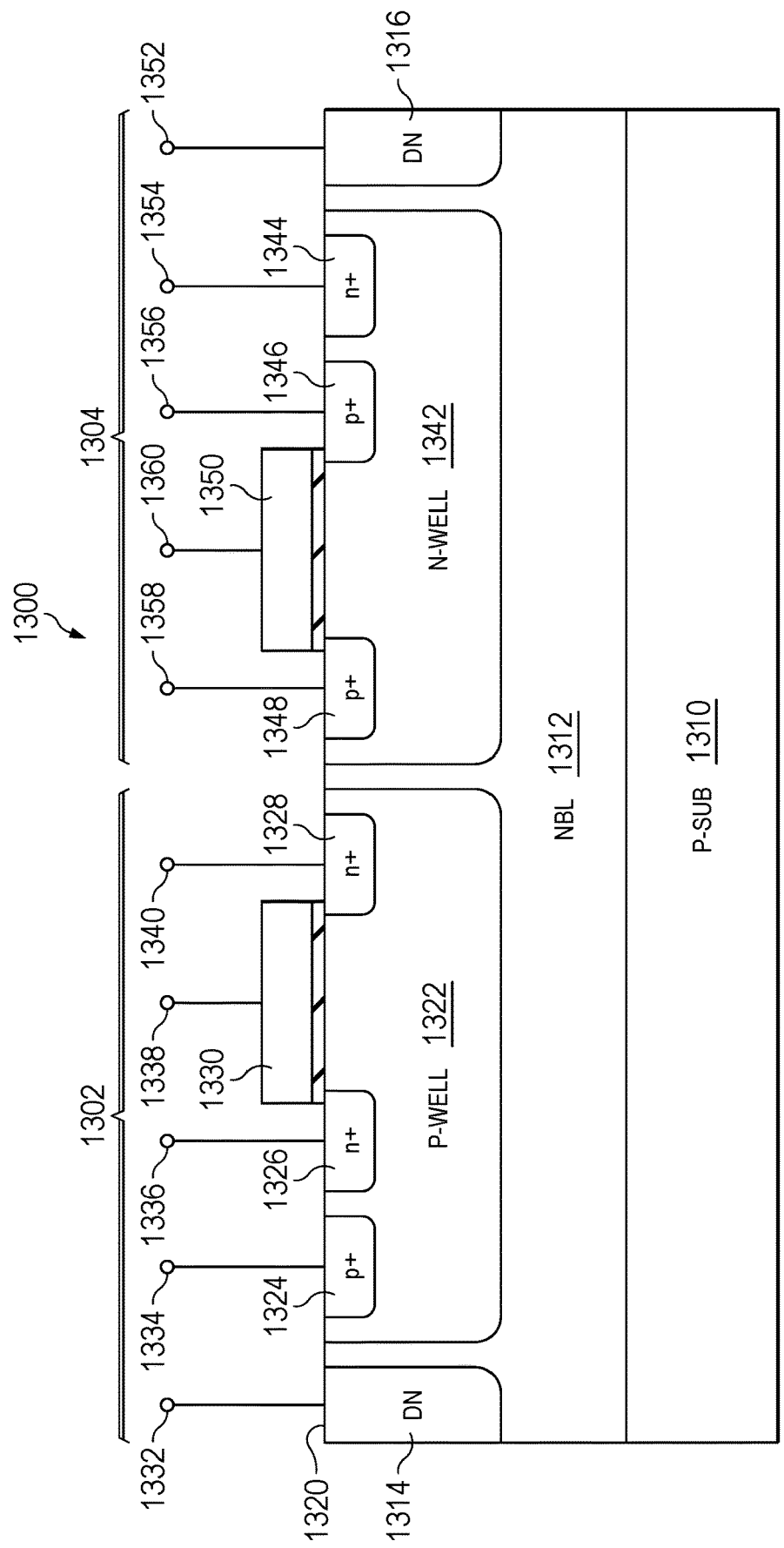
FIG. 13 illustrates schematics of semiconductor devices of the control circuit of FIG. 10.

In some examples, each of PFETs 1102, 1104, 1122, and 1124, and NFETs 1106 and 1126, can include a transistor having a source terminal, a drain terminal, a gate terminal, a body terminal, and an isolation terminal. FIG. 13 illustrates schematics of cross-sectional view of a semiconductor device 1300 including a PFET 1302 and an NFET 1304. PFET 1302 can provide PFETs 1102, 1104, 1122, and 1124 of FIGS. 11 and 12, and NFET 1304 can provide NFETs 1106 and 1126 of FIGS. 11 and 12. Referring to FIG. 13, semiconductor device 1300 can include a P-type substrate 1310, and an N-type buried layer (NBL) 1312 on P-type substrate 1310. PFET 1302 and NFET 1304 can be formed in NBL 1312, which can provide noise insulation to PFET 1302 and NFET 1304. Semiconductor device 1300 also include deep N-wells (DN) 1314 and 1316 to provide access to NBL 1312 from a front-side surface 1320 of semiconductor device 1300. DN 1314 can be adjacent to or be part of PFET 1302, and DN 1316 can be adjacent to or be part of NFET 1304. PFET 1302 can include a P-well 1322 as body, a p+ region 1324 to provide access to P-well 1322, n+ regions 1326 and 1328 that can be configured to be source and drain, and a gate 1330. Semiconductor device 1300 can include an isolation terminal 1332 coupled to DN 1314, a bulk terminal 1334 coupled to p+ region 1324, a current terminal 1336 coupled to n+ region 1326, a current terminal 1338 coupled to n+ region 1328, and a control terminal 1340 coupled to gate 1330.

Also, NFET 1304 can include an N-well 1342 as a body, an n+ region 1344 to provide access to N-well 1342, p+ regions 1346 and 1348 that can be configured to be source and drain, and a gate 1350. Semiconductor device 1300 can include an isolation terminal 1352 coupled to DN 1316, a bulk terminal 1354 coupled to p+ region 1344, a current terminal 1356 coupled to n+ region 1346, a current terminal 1358 coupled to n+ region 1348, and a control terminal 1360 coupled to gate 1350.

Each of PFETs 1102, 1104, 1122, and 1124, and NFETs 1106 and 1126, can have source, bulk, and isolation terminals coupled together to prevent latch up. For example, for PFETs 1102 and 1122, isolation terminal 1332, bulk terminal 1334, and current terminal 1336 can be coupled together at respective voltage terminals 226a and 246a, and current terminal 1336 can be the source terminal. Also, for PFETs 1104 and 1124, isolation terminal 1332, bulk terminal 1334, and current terminal 1336 can be coupled together at respective driver outputs 224 and 244. Further, for NFETs 1106 and 1126, isolation terminal 1352, bulk terminal 1354, and current terminal 1356 can be coupled together at respective voltage terminals 226b and 246b.

Referring again to FIGS. 11 and 12, ESD circuit 1002 can include an ESD pull-up control circuit 1160 to generate pull-up control signals 1032a and 1032b responsive to signal 1030 and control signal 232, and ESD circuit 1004 can include an ESD pull-up control circuit 1162 to generate pull-up control signals 1042a and 1042b responsive to signal 1040 and control signal 252. Specifically, responsive to signal 1030 indicating an ESD event, ESD pull-up control circuit 1160 can set pull-up control signal 1032a to have the same voltage as driver output 224, which can reduce the source-gate voltage of PFET 1104, and disable PFET 1104 and pull-up circuit 228. ESD pull-up control circuit 1160 can also forward control signal 232 as pull-up control signal 1032b. In some examples, ESD pull-up control circuit 1160 can also receive signal 1050, and set control signal 1032b to have the same voltage as voltage terminal 226a responsive to signal 1050 indicating that driver circuit 212 (and control circuit 100) is in a disabled state.

Also, responsive to signal 1040 indicating an ESD event, ESD pull-up control circuit 1162 can set pull-up control signal 1042a to have the same voltage as driver output 244, which can also reduce the source-gate voltage of PFET 1124 to below a threshold and disable PFET 1124 and pull-up circuit 248. ESD pull-up control circuit 1162 can also forward control signal 252 as pull-up control signal 1042b. In some examples, ESD pull-up control circuit 1162 can also receive signal 1060, and set pull-up control signal 1042b to have the same voltage as voltage terminal 246a to disable PFET 1122 responsive to signal 1060 indicating that driver circuit 214 (and control circuit 100) is in a disabled state.

In the example of FIG. 11, ESD circuit 1002 can forward control signal 232 as pull-down control signal 1034, and ESD circuit 1004 can forward control signal 252 as pull-down control signal 1044. In some examples, controller 260 can set control signals 232 and 252 to a high state (e.g., same voltages as voltage terminals 226a and 246a) to disable PFETs 1102 and 1122 prior to control circuit 100 being enabled, and NFETs 1106 and 1126 (of pull-down circuits 230 and 250) can also be enabled. But the enabled NFETs 1106 and 1126 can pull down the voltages at respective driver outputs 224 and 244 and disable switches 202 and 204, which can stop the switches from removing the electrostatic charge at input voltage terminal 102.

In FIG. 12, ESD circuit 1002 can include an ESD pull-down control circuit 1202, and ESD circuit 1004 can include an ESD pull-down control circuit 1204. ESD pull-down control circuit 1202 can provide pull-down control signal 1034 to disable NFET 1106 responsive to signal 1050 indicating that control circuit 100 is in the disabled state. Also, ESD pull-down control circuit 1204 can provide pull-down control signal 1044 to disable NFET 1126 responsive to signal 1060 indicating that control circuit 100 is in the disabled state. In an ESD event the voltages at the driver outputs 224 and 244 can increase due to the propagation of the ESD charge, and with NFETs 1106 and 1126 disabled, driver outputs 224 and 244 can be maintained at the high voltage state to enable switches 202 and 204. Such arrangements allow switches 202 and 204 to continue removing the electrostatic charge at input voltage terminal 102 via rectifier terminal 106.

Figure 14:
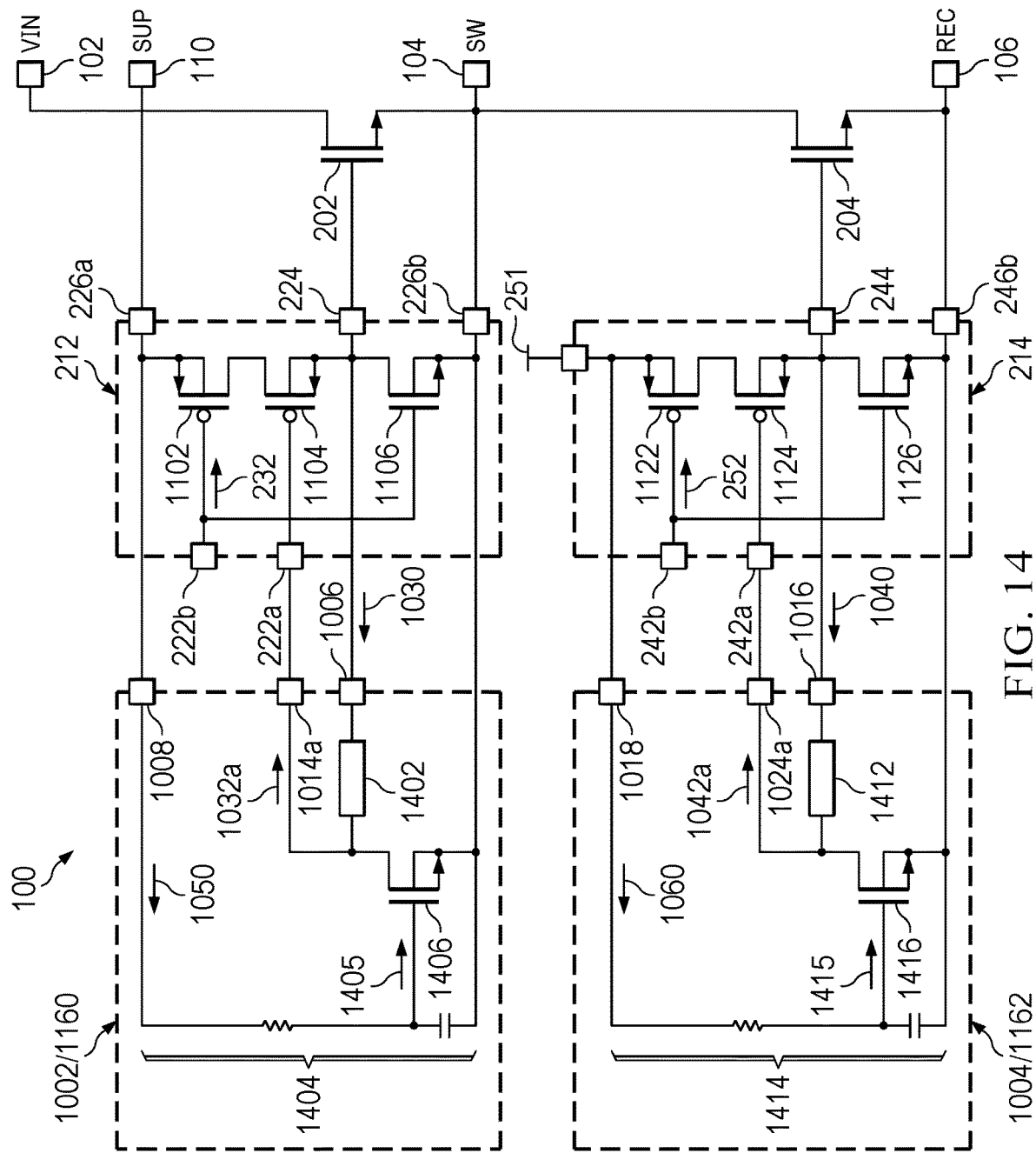
FIG. 14 illustrates schematics of example internal components of the ESD circuits of FIG. 10.

FIG. 14 illustrates schematics of example internal components of ESD pull-up control circuits 1160 and 1162. Referring to FIG. 14, ESD input 1006 of ESD pull-up control circuit 1160 can be coupled to driver output 224. ESD pull-up control circuit 1160 can include a sensing circuit 1402 coupled between ESD input 1006 and ESD control signal output 1014a, which couples to the gate of PFET 1104 via driver input 222a. Sensing circuit 1402 can include a resistor or a capacitor coupled between ESD input 1006 and ESD control signal output 1014a. Sensing circuit 1402 can sense the voltage at driver output 224 (as signal 1030) and provide a voltage signal at the gate of PFET 1104 (as pull-up control signal 1032a). ESD pull-up control circuit 1160 can also include an RC filter 1404 coupled between driver power state input 1008 and switching terminal 104, and driver power state input 1008 can be coupled to internal voltage supply terminal 110. RC filter 1404 can receive a voltage of internal voltage supply terminal 110 (as signal 1050), and provide a filtered voltage as voltage signal 1405. ESD pull-up control circuit 1160 can also include an NFET 1406 coupled between ESD control signal output 1014a and switching terminal 104, and the gate of NFET 1406 coupled to the RC filter output. NFET 1406 can be enabled or disabled by voltage signal 1405 provided by RC filter 1404. In some examples, the gate of NFET 1406 can also be coupled to enable terminal 112, and NFET 1406 can be enabled or disabled based on enable signal 262. The gates of PFET 1102 and NFET 1106 are coupled to driver input 222b, which can receive control signal 232 from controller 260 that bypasses or otherwise is buffered by ESD pull-up control circuit 1160.

Also, ESD input 1016 of ESD pull-up control circuit 1162 can be coupled to driver output 244. ESD pull-up control circuit 1162 can include a sensing circuit 1412 coupled between ESD input 1016 and ESD control signal output 1024a, which couples to the gate of PFET 1124 via driver input 242a. Sensing circuit 1412 can include a resistor or an AC capacitor coupled between ESD input 1016 and ESD control signal output 1024a. Sensing circuit 1412 can sense the voltage at driver output 244 (as signal 1040) and provide a voltage signal at the gate of PFET 1124 (as pull-up control signal 1042a). ESD pull-up control circuit 1162 can also include an RC filter 1414 coupled between driver power state input 1018 and rectifier terminal 106, and driver power state input 1018 can be coupled to switching terminal 104. RC filter 1414 can receive a voltage of internal voltage supply terminal 110 (as signal 1060), and provide a filtered voltage as a voltage signal 1415. ESD pull-up control circuit 1162 can also include an NFET 1416 coupled between ESD control signal output 1024a and rectifier terminal 106, and the gate of NFET 1416 coupled to the RC filter output. NFET 1416 can be enabled or disabled by voltage signal 1415 provided by RC filter 1414. In some examples, the gate of NFET 1416 can also be coupled to enable terminal 112, and NFET 1416 can be enabled or disabled based on enable signal 262. The gates of PFET 1122 and NFET 1126 are coupled to driver input 242b, which can receive control signal 252 from controller 260 that bypasses or otherwise is buffered by ESD pull-up control circuit 1162.

When control circuit 100 is enabled and there is no ESD event, internal voltage supply terminal 110 can have a higher voltage than input voltage terminal 102 and switching terminal 104. For example, referring again to FIG. 3, internal voltage supply terminal 110 can have an internal supply voltage $V_{SUP}$ higher than input voltage $V_i$ and switching terminal voltage $V_{SW}$. Accordingly, RC filter 1404 of ESD pull-control circuit 1160 can generate a voltage signal 1405 having a higher voltage than switching terminal 104, and NFET 1406 can be enabled. NFET 1406 can also be enabled by enable signal 262. ESD pull-up control circuit 1160 can connect ESD control signal output 1014a to switching terminal 104, and provide pull-up control signal 1032a that tracks $V_{SW}$, which enables PFET 1104. The state of driver output 224 can toggle between $V_{SUP}$ and $V_{SW}$, as shown in graph 402 of FIG. 4, based on the state of control signal 232.

Also, internal voltage supply 251 can supply a voltage (e.g., $V_{CC}$) higher than the voltage of rectifier terminal 106. Accordingly, RC filter 1414 of ESD pull-control circuit 1162 can generate a voltage signal 1415 having a higher voltage than rectifier terminal 106, and NFET 1416 can be enabled. NFET 1416 can also be enabled by enable signal 262. ESD pull-up control circuit 1162 can connect ESD control signal output 1024a to rectifier terminal 106, and provide pull-up control signal 1042a having the voltage of rectifier terminal 106 (e.g., a ground voltage), which enables PFET 1124. The state of driver output 244 can also then toggle between $V_{CC}$ and the ground voltage, as shown in graph 404 of FIG. 4, based on the state of control signal 252.

Figure 15:
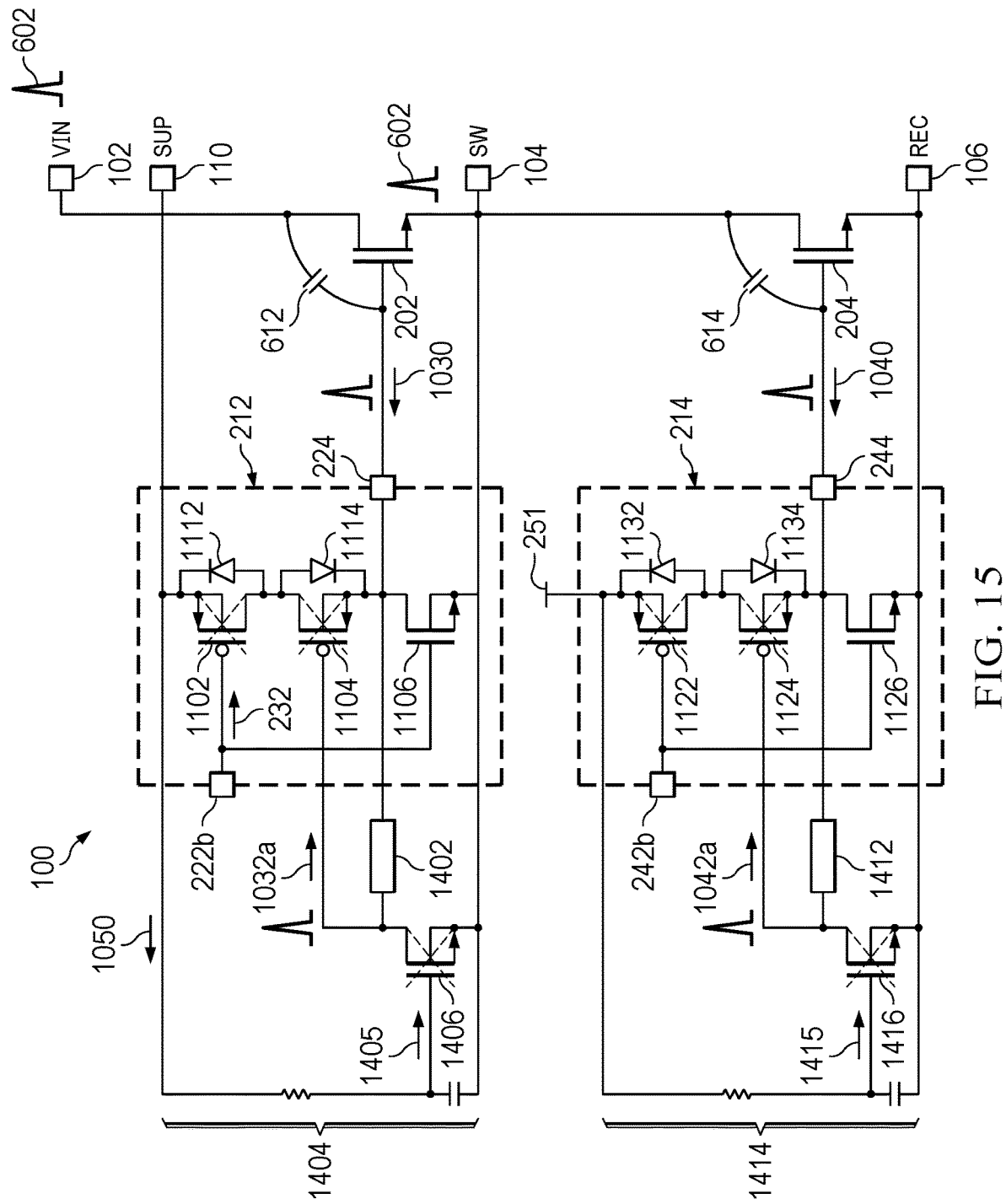
FIG. 15 illustrates example operations of the ESD circuits of FIG. 10 in an ESD event.

FIG. 15 illustrates schematics of example operation of ESD pull-up control circuits 1160 and 1162 in an ESD event when control circuit 100 is in a disabled state. Referring to FIG. 15, when control circuit 100 is in a disabled state, both internal voltage supply terminal 110 and internal voltage supply 251 can have a low voltage (e.g., ground voltage). Accordingly, RC filter 1404 of ESD pull-up control circuit 1160 can generate a voltage signal 1405 also having a low voltage to disable NFET 1406, and RC filter 1414 of ESD pull-up control circuit 1162 can generate a voltage signal 1415 also having a low voltage to disable NFET 1416.

During the ESD event, input voltage terminal 102 may receive ESD signal 602 including a pulse of electrostatic charge. ESD signal 602 can propagate through parasitic capacitance 612 of switch 202 and deposit charge at the gate/control terminal of switch 202, which increases the voltage of driver output 224. With NFET 1406 disabled and not pulling down the gate of PFET 1104, sensing circuit 1402 can transmit the increased voltage as pull-up control signal 1032a to the gate of PFET 1104 and disable PFET 1104. Also, when control circuit 100 is in the disabled state, controller 260 can provide a control signal 232 having a high voltage to disable PFET 1102. Accordingly, both PFETs 1102 and 1104 are disabled, and the increased voltage at driver output 224 can be blocked from reaching internal voltage supply terminal 110 by the back-to-back body diodes 1112 (of PFET 1102) and 1114 (of PFET 1104).

Also, the increased voltage of driver output 224 can enable switch 202, and the enabled switch 202 can transmit ESD signal 602 to switching terminal 104. From switching terminal 104, ESD signal 602 can propagate through parasitic capacitance 614 and deposit charge at the gate/control terminal of switch 204, which increases the voltage of driver output 244 of driver circuit 214. With NFET 1416 disabled and not pulling down the gate of PFET 1124, sensing circuit 1412 can transmit the increased voltage as pull-up control signal 1042a to the gate of PFET 1124 and disable PFET 1124. Also, when control circuit 100 is in the disabled state, controller 260 can provide a control signal 252 having a high voltage to disable PFET 1122. Accordingly, both PFETs 1122 and 1124 are disabled, and the increased voltage at driver output 244 can be blocked from reaching internal voltage supply 251 by the back-to-back body diodes 1132 (of PFET 1122) and 1134 (of PFET 1124).

Figure 16:
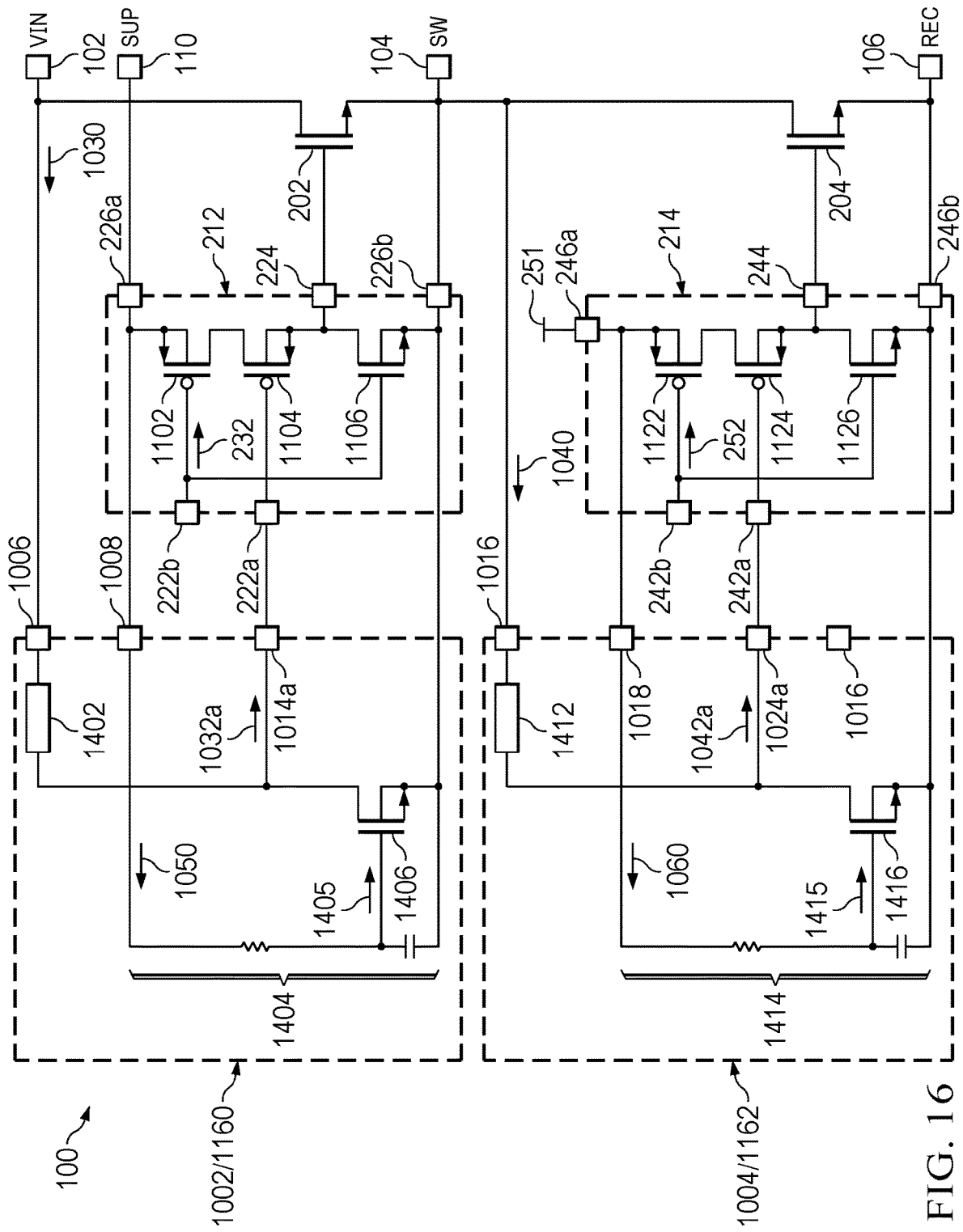
FIG. 16, FIG. 17, and FIG. 18 illustrate schematics of example internal components of the ESD circuits of FIG. 10.

FIG. 16 illustrates schematics of another example of ESD pull-up control circuits 1160 and 1162. Referring to FIG. 16, ESD input 1006 can be coupled to input voltage terminal 102, and ESD input 1016 can be coupled to switching terminal 104, to sense the ESD event. In such examples, sensing circuits 1402 and 1412 can each include a capacitive divider, which provides a scaled down version of a voltage at respective input voltage terminals 102 and switching terminal 104. During the ESD event, sensing circuit 1402 can provide pull-up control signal 1032a by scaling down signal 1030 (e.g., ESD signal 602 at input voltage terminal 102), and sensing circuit 1412 can provide pull-up control signal 1042a by scaling down signal 1040 (e.g., ESD signal 602 transmitted by switch 202 to switching terminal 104).

Figure 17:
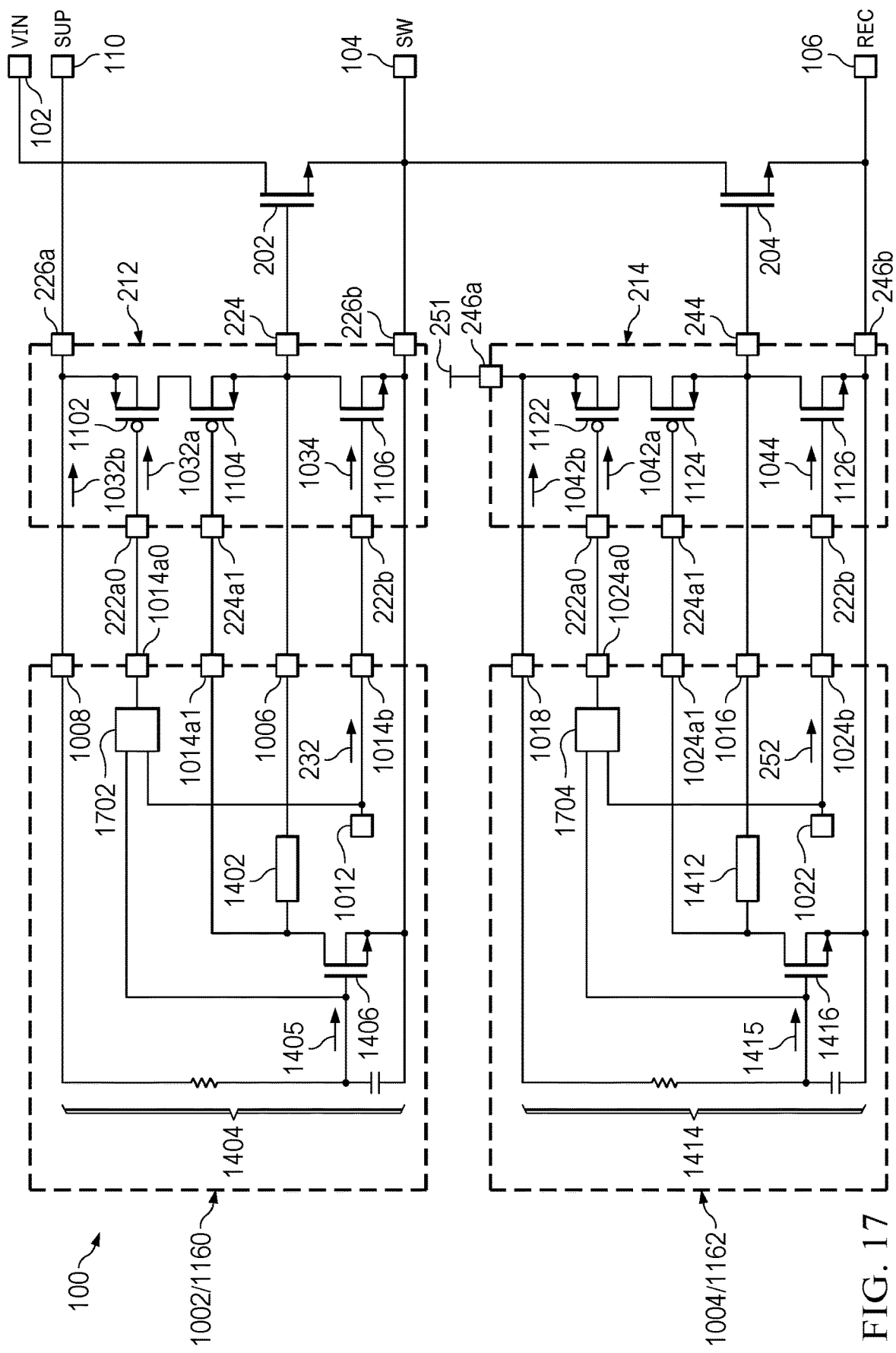

FIG. 17 illustrates schematics of another example of ESD pull-up control circuits 1160 and 1162. Referring to FIG. 17, ESD pull-up control circuit 1160 can include control signal input 1012 to receive control signal 232 from controller 260. ESD pull-up control circuit 1160 can forward control signal 232 as pull-down control signal 1034 to NFET 1106. ESD pull-up control circuit 1160 can also provide pull-up control signal 1032a to PFET 1104 as described above. Also, ESD pull-up control circuit 1160 can include a logic circuit 1702 coupled to the output of RC filter 1404 and control signal input 1012. Logic circuit 1702 can include a NAND logic gate to provide pull-up control signal 1032b to PFET 1102 based on signal 1405 from RC filter 1404 (or enable signal 262) and control signal 232. Logic circuit 1702 can provide pull-up control signal 1032b having a high voltage (e.g., higher than internal supply voltage terminal 110) to disable PFET 1102, if signal 1405 or enable signal 262 indicate that control circuit 100 is disabled. Logic circuit 1702 can also forward control signal 232 as pull-up control signal 1032b if control circuit 100 is enabled.

Also, ESD pull-up control circuit 1162 can include control signal input 1022 to receive control signal 232 from controller 260. ESD pull-up control circuit 1162 can forward control signal 252 as pull-down control signal 1044 to NFET 1126. ESD pull-up control circuit 1162 can also provide pull-up control signal 1042a to PFET 1124 as described above. Also, ESD pull-up control circuit 1162 can include a logic circuit 1704 coupled to the output of RC filter 1414 and control signal input 1022. Logic circuit 1704 can also include a NAND logical gate to provide pull-up control signal 1042b to PFET 1122 based on signal 1415 from RC filter 1414 (or enable signal 262) and control signal 252. Logic circuit 1704 can provide pull-up control signal 1042b having a high voltage (e.g., higher than switching terminal 104) to disable PFET 1122 if signal 1415 or enable signal 262 indicate that control circuit 100 is disabled. Logic circuit 1704 can also forward control signal 252 as pull-up control signal 1042b if control circuit 100 is enabled.

Figure 18:
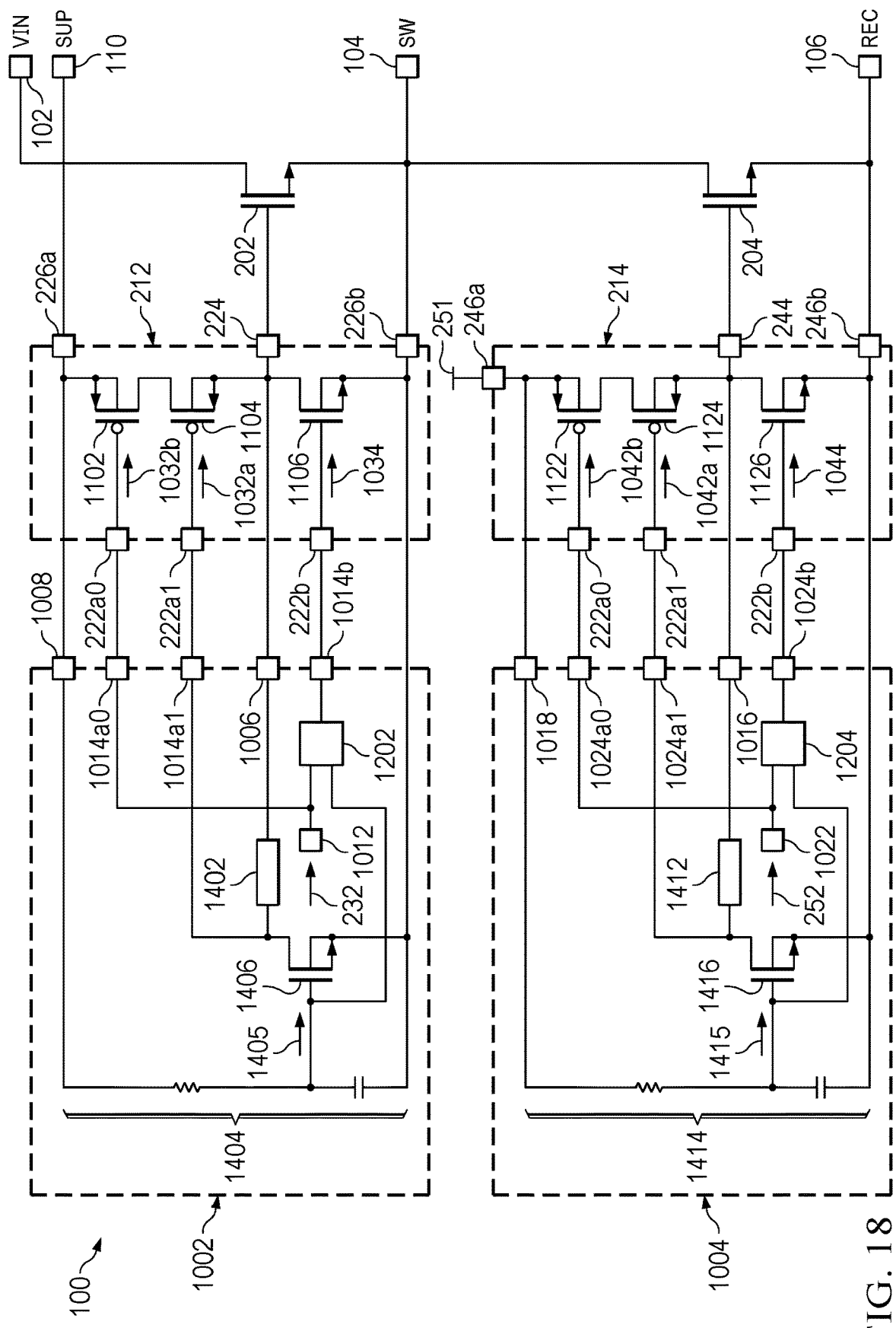

FIG. 18 illustrates schematics of example ESD circuits 1002 and 1004 including the respective pull-down control circuits 1202 and 1204. Referring to FIG. 18, ESD circuit 1002 can include ESD pull-down control circuit 1202. Pull-down control circuit 1202 can include a logic gate, such as logic AND gate, coupled to control signal input 1012 and the output of RC filter 1404. Pull-down control circuit 1202 can provide pull-down control signal 1034 having a low voltage (e.g., a ground voltage) to disable NFET 1106 if signal 1405 has a low voltage (e.g., a ground voltage) indicating that control circuit 100 is disabled. In some examples, ESD pull-down control circuit 1202 can also be coupled to enable terminal 102, and can provide pull-down control signal 1034 having a low voltage to disable NFET 1106 if enable signal 262 indicates that control circuit 100 is disabled. ESD pull-down control circuit 1202 can also forward control signal 232 as pull-down control signal 1034 if control circuit 100 is enabled. ESD circuit 1002 also includes ESD pull-up control circuit 1160 (e.g., sensing circuit 1402, logic circuit 1702 of FIG. 17) to generate pull-up control signals 1032a and 1032b.

ESD circuit 1004 can include ESD pull-down control circuit 1202. Pull-down control circuit 1202 can include a logic gate, which can also be a logic AND gate, coupled to control signal input 1022 and the output of RC filter 1414. Pull-down control circuit 1202 can provide pull-down control signal 1044 having a low voltage (e.g., a ground voltage) to disable NFET 1126 if signal 1415 has a low voltage (e.g., a ground voltage) indicating that control circuit 100 is disabled. In some examples, ESD pull-down control circuit 1204 can also be coupled to enable terminal 102, and can provide pull-down control signal 1044 having a low voltage to disable NFET 1126 if enable signal 262 indicates that control circuit 100 is disabled. ESD pull-down control circuit 1204 can also forward control signal 252 as pull-down control signal 1044 if control circuit 100 is enabled. ESD circuit 1004 also includes ESD pull-up control circuit 1162 (e.g., sensing circuit 1412, logic circuit 1704 of FIG. 17) to generate pull-up control signals 1042a and 1042b.

Figure 19:
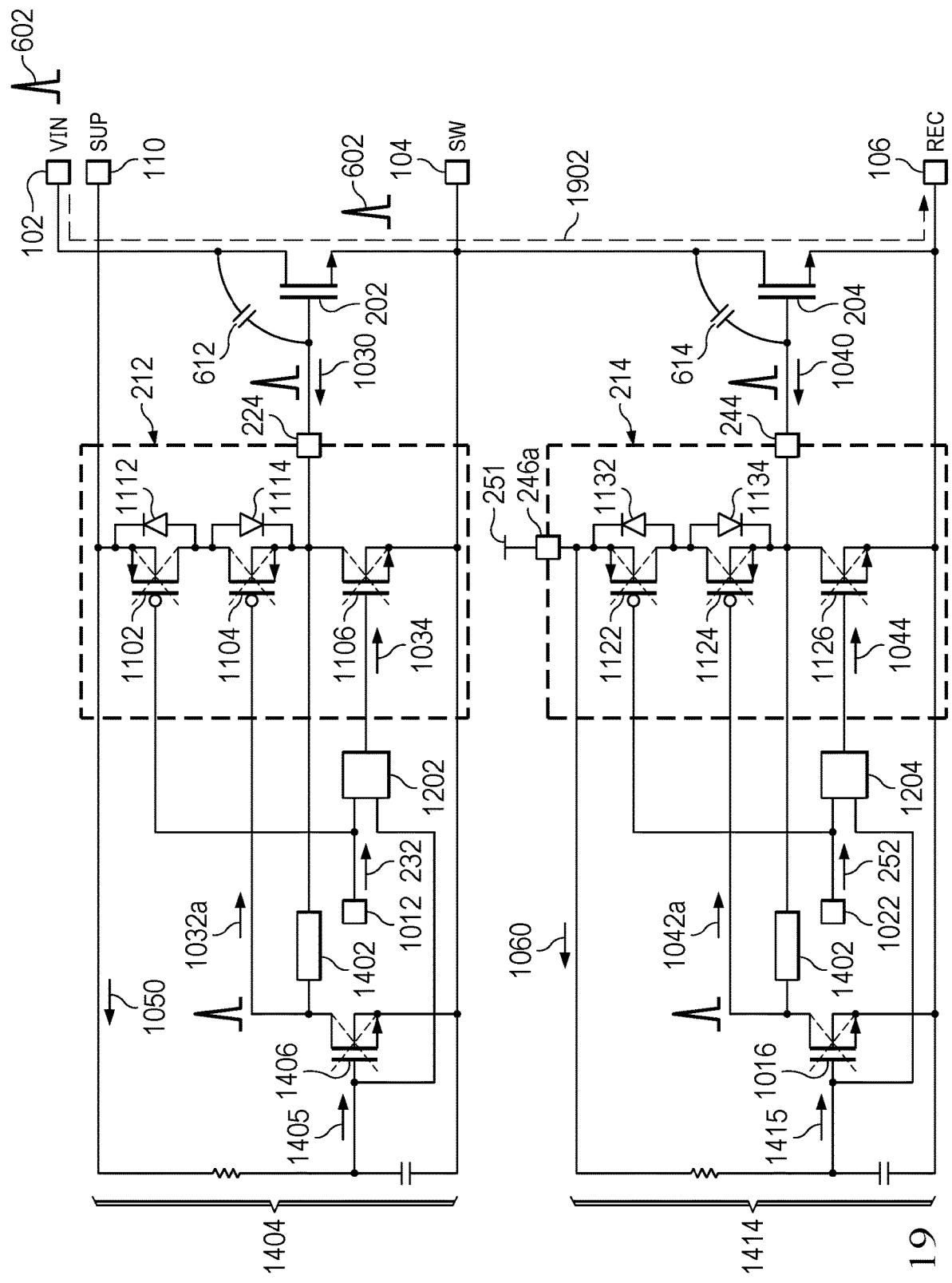
FIG. 19 illustrates example operations of the ESD circuits of FIG. 10 in an ESD event.

FIG. 19 illustrates schematics of example operations of ESD circuits 1002 and 1004 in an ESD event when control circuit 100 is in a disabled state. The operations of ESD pull-up control circuits 1160 (including sensing circuit 1402) and 1162 (including sensing circuit 1412) are identical to the example operations described in FIG. 15. Also, because control circuit 100 is in a disabled state, RC filters 1404 and 1414 can provide respective signals 1405 and 1415 having a low voltage. Accordingly, ESD pull-down control circuit 1202 can provide pull-down control signal 1034 having a low voltage, and ESD pull-down control circuit 1204 can provide pull-down control signal 1044 having a low voltage. NFETs 1106 and 1126 can be disabled, and the increased voltages (due to propagation of ESD signal 602) at driver outputs 224 and 244 can be maintained. Accordingly, switches 202 and 204 can remain enabled to drain away ESD current 1902 from input voltage terminal 102 via rectifier terminal 106 to ground.

Figure 20:
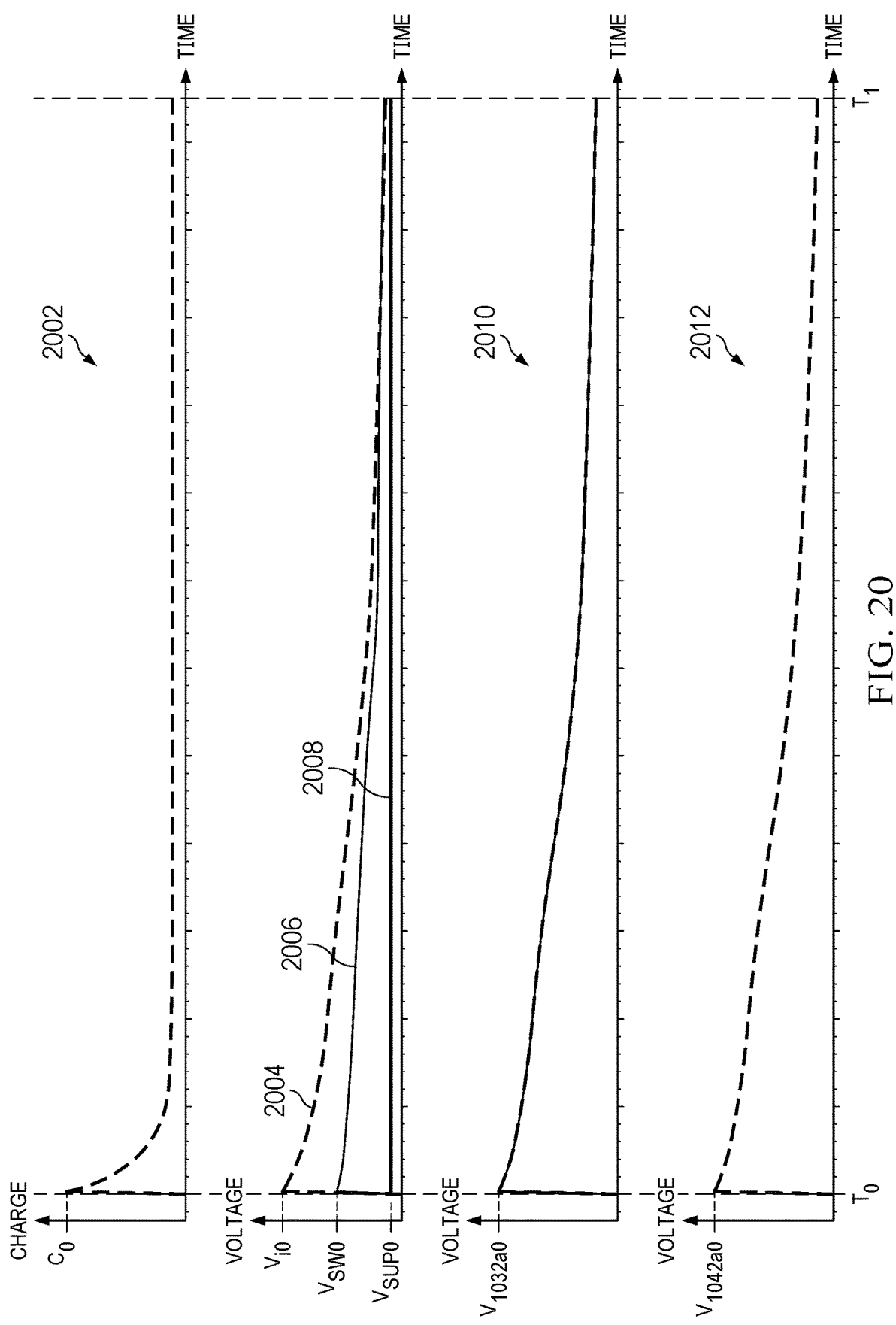
FIG. 20 includes waveform graphs that illustrate example operations of the ESD circuits of FIG. 10 in an ESD event.

FIG. 20 includes waveform graphs that illustrate example operations of ESD circuits 1002 and 1004 in an ESD event. FIG. 20 includes graphs 2002, 2004, 2006, 2008, 2010, and 2012. Graph 2002 illustrates the time-variation of electrostatic charge at input voltage terminal 102, and graph 2004 illustrates the time-variation of a voltage at input voltage terminal 102 ($V_i$). Also, graph 2006 illustrates the time-variation of a voltage at switching terminal 104 ($V_{SW}$), and graph 2008 illustrates the time-variation of a voltage at internal voltage supply terminal 110 ($V_{SUP}$). Further, graph 2010 illustrates the time-variation of pull-up control signal 1032a provided by ESD circuit 1002, and graph 2012 illustrates the time-variation of pull-up control signal 1042a provided by ESD circuit 1004.

At time $T_0$, an ESD event occur, and input voltage terminal 102 receives electrostatic charge represented by $C_0$ in graph 2002. Because of the electrostatic charge, the voltage at input voltage terminal 102 rises to $V_{i0}$. The electrostatic charge can propagate through parasitic capacitance 612 and charge up the capacitance at driver output 224 of ESD circuit 1002, which increases the voltage at driver output 224 and enables switch 202. The enabled switch 202 can transmit the electrostatic charge to switching terminal 104, which increases the voltage of switching terminal 104 to $V_{SW0}$. The electrostatic charge can also propagate from switching terminal 104 to driver output 244 via parasitic capacitance 614 and increase the voltage at driver output 244, which enables switch 204.

Sensing circuit 1402 can provide control pull-up control signal 1032a based on the increased driver output 224. Accordingly, pull-up control signal 1032a can reach a peak voltage $V_{1032a0}$ at $T_0$. Also, sensing circuit 1402 can provide pull-up control signal 1042a based on the increased driver output 244. Accordingly, pull-up control signal 1042a can reach a peak voltage $V_{1042a0}$ at $T_0$. Because control signal 1032a has a high voltage, PFET 1104 can be disabled to block the electrostatic charge from reaching internal voltage supply terminal 110. Accordingly, the voltage of internal voltage supply terminal 110 can stay at $V_{SUP0}$.

After time $T_0$, ESD circuit 1002 can disable NFET 1106 and maintain the increased voltage at driver output 224, and switch 202 can be enabled. Also, ESD circuit 1004 can disable NFET 1116 and maintain the increased voltage at driver output 244, and switch 204 can be enabled. Accordingly, the electrostatic charge at input voltage terminal 102 can be drained away to ground through switches 202 and 204, and both the electrostatic charge and the voltage at input voltage terminal 102 reduce with time. The charge at driver outputs 224 and 244 also reduce with time because the charge leak through the respective parasitic capacitances 612 and 614 and switches 202 and 204 to ground, and the voltages at driver outputs 224 and 244 also reduce. Accordingly, the voltages of pull-up control signals 1032a and 1042a, which track the voltages at driver outputs 224 and 244, also reduce with time. But because switches 202 and 204 remain enabled, the voltage of switching terminal 104 tracks the voltage at input voltage terminal 102 and also reduce with time. The voltages at input voltage terminal 102 ($V_i$) and switching terminal 104 ($V_{SW}$) can reduce and approach the voltage at internal supply voltage terminal 110 ($V_{SUP0}$) at time $T_1$ when most or all of the ESD charge has been removed.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between identical two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible, within the scope of the claims.

What is claimed is:

1. A circuit comprising:
   a controller having a driver control output
   an electrostatic discharge (ESD) circuit having an ESD input, a driver control input, a first ESD output, a second ESD output, and a driver power input, wherein the driver control input is coupled to the driver control output;
   a driver circuit having a first driver input, a second driver input, a driver output, a first voltage terminal, a second voltage terminal, a pull-up circuit coupled between the first voltage terminal and the driver output, a pull-down circuit coupled between the driver output and the second voltage terminal, wherein the first driver input is coupled to the first ESD output, the second driver input is coupled to the second ESD output, a pull-up control terminal of the pull-up circuit is coupled to the first driver input, and a pull-down control terminal of the pull-down circuit is coupled to the second driver input;

the ESD circuit is configured to provide a pull-down control signal at the second ESD output responsive to a state of the driver power input; and the pull-down circuit is configured to disconnect the driver output from the second voltage terminal responsive to the pull-down control signal.

2. The circuit of claim 1, wherein the state of the ESD input indicates whether an ESD event occurs.

3. The circuit of claim 1, wherein the state of the driver power input indicates whether the driver circuit is in a disabled state.

4. The circuit of claim 1, wherein the ESD input is coupled to a power converter input terminal or a power converter switching terminal.

5. The circuit of claim 1, wherein the driver power input is coupled to the first voltage terminal.

6. The circuit of claim 1, wherein the controller has an enable terminal coupled to the driver power input.

7. The circuit of claim 1, wherein:

the ESD circuit has a third ESD output coupled to the driver control input;

the driver circuit has a third driver input coupled to the third ESD output, the driver circuit including:

a first transistor having first and second current terminals and a first control terminal, the first current terminal coupled to the first voltage terminal, and the first control terminal coupled to the third driver input;

a second transistor having third and fourth current terminals and a second control terminal, the third current terminal coupled to the second current terminal, the fourth current terminal coupled to the driver output, and the second control terminal coupled to the first driver input; and a third transistor having fifth and sixth current terminals and a third control terminal, the fifth current terminal coupled to the fourth current terminal and to the driver output, the sixth current terminal coupled to the second voltage terminal, and the third control terminal coupled to the second driver input.

8. The circuit of claim 7, wherein:

the first transistor includes a first body diode having a first cathode and a first anode, in which the first cathode is the first current terminal, and the first anode is the second current terminal; and the second transistor includes a second body diode having a second cathode and a second anode, in which the second anode is the third current terminal, and the second cathode is the fourth current terminal.

9. The circuit of claim 7, wherein the ESD circuit includes a sensing circuit coupled between the ESD input and the first ESD output, the sensing circuit including at least one of: a resistor, a capacitor, or a capacitive divider.

10. The circuit of claim 7, wherein:

the ESD circuit includes a logic circuit having a first logic input, a second logic input, and a logic output;

the first logic input is coupled to the driver power input;

the second logic input is coupled to the driver control input; and the logic output coupled to the third ESD output.

11. The circuit of claim 7, wherein the ESD circuit includes a fourth transistor coupled between the first ESD output and the second voltage terminal, the fourth transistor having a fourth control terminal coupled to the driver power input.

12. The circuit of claim 11, wherein the ESD circuit includes an RC filter having an RC filter input and an RC filter output, the RC filter input coupled to the driver power input, and the RC filter output coupled to the fourth control terminal.

13. The circuit of claim 7, wherein:

the ESD circuit includes a logic circuit having a first logic input, a second logic input, and a logic output;

the first logic input is coupled to the driver power input;

the second logic input is coupled to the driver control input; and the logic output is coupled to the second ESD output.

14. An integrated circuit comprising:

a controller having a first driver control output and a second driver control output;

a first ESD circuit having a first driver control input and a first ESD output, the first driver control input coupled to the first driver control output;

a second ESD circuit having a second driver control input and a second ESD output, the second driver control input coupled to the second driver control output;

a voltage regulator having a regulator output;

a first driver circuit coupled between an internal supply voltage terminal and a switching terminal and having a first driver input and a first driver output, the first driver input coupled to the first ESD output;

a second driver circuit coupled between the regulator output and a rectifier terminal and having a second driver input and a second driver output, the second driver input coupled to the second ESD output;

a first transistor coupled between an input voltage terminal and the switching terminal and having a first control terminal coupled to the first driver output; and a second transistor coupled between the switching terminal and the rectifier terminal and having a second control terminal coupled to the second driver output.

15. The integrated circuit of claim 14, wherein the first and second ESD circuits are configured to enable the respective first and second transistors via the respective first and second driver circuits responsive to an ESD event at the input voltage terminal.

16. The integrated circuit of claim 14, wherein:

the first ESD circuit has a first ESD input and is configured to provide a first control signal at the first ESD output responsive to a state of the first ESD input;

the first driver circuit is configured to, responsive to the first control signal, disconnect the internal supply voltage terminal from the first driver output;

the second ESD circuit has a second ESD input is configured to provide a second control signal at the second ESD output responsive to a state of the second ESD input; and the second driver circuit is configured to, responsive to the second control signal, disconnect the regulator output from the second driver output.

17. The integrated circuit of claim 16, wherein the first ESD input is coupled to the first driver output and the second ESD input is coupled to the second driver output.

18. The integrated circuit of claim 14, wherein:

the first ESD circuit has a first driver power input and a third ESD output, the first driver power input coupled to the internal supply voltage terminal;

the first driver circuit has a third driver input coupled to the third ESD output;

the first ESD circuit is configured to provide a third control signal at the third ESD output responsive to a state of the first driver power input;

the first driver circuit is configured to disconnect the switching terminal from the first driver output responsive to the third control signal;

the second ESD circuit has a second driver power input and a fourth ESD output, the second driver power input coupled to the switching terminal;

the second driver circuit has a fourth driver input coupled to the fourth ESD output;

the second ESD circuit is configured to provide a fourth control signal at the fourth ESD output responsive to a state of the second driver power input; and the second driver circuit is configured to disconnect the rectifier terminal from the second driver output responsive to the fourth control signal.

\* \* \* \* \*